(12) United States Patent
Zeidler et al.

(10) Patent No.: US 12,293,896 B2
(45) Date of Patent: May 6, 2025

(54) PARTICLE BEAM SYSTEM

(71) Applicant: Carl Zeiss MultiSEM GmbH, Oberkochen (DE)

(72) Inventors: Dirk Zeidler, Oberkochen (DE); Hans Fritz, Glottertal (DE); Ingo Mueller, Aalen (DE); Stefan Schubert, Oberkochen (DE); Arne Thoma, Aalen (DE); András Major, Oberkochen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 1175 days.

(21) Appl. No.: 17/125,825

(22) Filed: Dec. 17, 2020

(65) Prior Publication Data
US 2021/0142980 A1 May 13, 2021

Related U.S. Application Data

(63) Continuation of application No. PCT/EP2019/066058, filed on Jun. 18, 2019.

(30) Foreign Application Priority Data

Jun. 21, 2018 (DE) .......................... 102018115012.1

(51) Int. Cl.
*H01J 37/317* (2006.01)
*H01J 37/14* (2006.01)
*H01J 37/147* (2006.01)

(52) U.S. Cl.
CPC .......... *H01J 37/3177* (2013.01); *H01J 37/14* (2013.01); *H01J 37/1471* (2013.01); *H01J 2237/0453* (2013.01); *H01J 2237/141* (2013.01)

(58) Field of Classification Search
CPC ........ H01J 37/1474; H01J 37/20; H01J 37/10; H01J 37/06; H01J 37/22; H01J 37/3177; H01J 37/14; H01J 37/1471
See application file for complete search history.

(56) References Cited

U.S. PATENT DOCUMENTS 4,130,761 A 12/1978 Matsuda
4,153,843 A 5/1979 Pease
(Continued)

FOREIGN PATENT DOCUMENTS

CN 102610479 A 7/2012
CN 105161393 A 12/2015
(Continued)

OTHER PUBLICATIONS

Japanese Decision of Rejection, with translation thereof, for corresponding JP Appl. No. 2020-571464 dated Oct. 28, 2022.
(Continued)

*Primary Examiner* — Joseph L Williams
(74) *Attorney, Agent, or Firm* — Fish & Richardson P.C.

(57) ABSTRACT

A particle beam system includes: a multi-beam particle source configured to generate a multiplicity of particle beams; an imaging optical unit configured to image an object plane in particle-optical fashion into an image plane and direct the multiplicity of particle beams on the image plane; and a field generating arrangement configured to generate electric and/or magnetic deflection fields of adjustable strength in regions close to the object plane. The particle beams are deflected in operation by the deflection fields through deflection angles that depend on the strength of the deflection fields.

33 Claims, 9 Drawing Sheets

(56) References Cited

U.S. PATENT DOCUMENTS

| | | |
|---|---|---|
| 4,200,794 A | 4/1980 | Newberry |
| 4,338,548 A | 7/1982 | Bono |
| 4,742,234 A | 5/1988 | Feldman |
| 5,215,623 A | 6/1993 | Takahashi |
| 5,834,783 A | 11/1998 | Muraki et al. |
| 5,864,142 A | 1/1999 | Muraki |
| 5,892,224 A | 4/1999 | Nakasuji |
| 5,905,267 A | 5/1999 | Muraki |
| 5,981,954 A | 11/1999 | Muraki |
| 6,107,636 A | 8/2000 | Muraki |
| 6,124,599 A | 9/2000 | Muraki |
| 6,137,113 A | 10/2000 | Muraki |
| 6,323,499 B1 | 11/2001 | Muraki |
| 6,333,508 B1 | 12/2001 | Katsap |
| 6,617,595 B1 | 9/2003 | Okunuki |
| 6,633,366 B2 | 10/2003 | De Jager |
| 6,696,371 B2 | 2/2004 | Butschke |
| 6,787,780 B2 | 9/2004 | Hamaguchi |
| 6,804,288 B2 | 10/2004 | Haraguchi |
| 6,818,911 B2 | 11/2004 | Tamamori |
| 6,835,508 B2 | 12/2004 | Butschke |
| 6,872,950 B2 | 3/2005 | Shimada |
| 6,903,345 B2 | 6/2005 | Ono |
| 6,903,353 B2 | 6/2005 | Muraki |
| 6,917,045 B2 | 7/2005 | Hashimoto |
| 6,919,574 B2 | 7/2005 | Hashimoto |
| 6,943,349 B2 | 9/2005 | Adamec |
| 6,953,938 B2 | 10/2005 | Iwasaki |
| 6,992,290 B2 | 1/2006 | Watanabe |
| 7,005,658 B2 | 2/2006 | Muraki |
| 7,015,467 B2 | 3/2006 | Maldonado |
| 7,060,984 B2 | 6/2006 | Nagae et al. |
| 7,084,411 B2 | 8/2006 | Lammer-Pachlinger |
| 7,091,504 B2 | 8/2006 | Wieland |
| 7,109,494 B2 | 9/2006 | Ono |
| 7,126,141 B2 | 10/2006 | Ono |
| 7,129,502 B2 | 10/2006 | Kruit |
| 7,244,949 B2 | 7/2007 | Knippelmeyer |
| 7,285,779 B2 | 10/2007 | Litman |
| 7,375,326 B2 | 5/2008 | Sender |
| 7,378,671 B2 | 5/2008 | Muraki et al. |
| 7,420,164 B2 | 9/2008 | Nakasuji |
| 7,468,507 B2 | 12/2008 | Rogers |
| 7,504,622 B2 | 3/2009 | Elyasaf |
| 7,535,001 B2 | 5/2009 | Sender |
| 7,601,972 B2 | 10/2009 | Nakasuji |
| 7,619,203 B2 | 11/2009 | Elyasaf |
| 7,696,497 B2 | 4/2010 | Rogers |
| 8,035,082 B2 | 10/2011 | Yamazaki |
| 8,134,135 B2 | 3/2012 | Kruit |
| 8,350,214 B2 | 1/2013 | Otaki |
| 8,362,425 B2 | 1/2013 | Han |
| 8,384,051 B2 | 2/2013 | Ozawa |
| 8,598,525 B2 | 12/2013 | Zeidler |
| 8,618,496 B2 | 12/2013 | Wieland |
| 8,704,192 B2 | 4/2014 | Sano |
| 8,748,841 B2 | 6/2014 | Sano |
| 8,748,842 B2 | 6/2014 | Ohashi |
| 8,779,399 B2 | 7/2014 | Yamanaka |
| 8,829,465 B2 | 9/2014 | Tsunoda |
| 8,963,099 B2 | 2/2015 | Yamada |
| 9,153,413 B2 | 10/2015 | Almogy |
| 9,263,233 B2 | 2/2016 | Zeidler |
| 9,336,981 B2 | 5/2016 | Knippelmeyer |
| 9,336,982 B2 | 5/2016 | Zeidler |
| 9,349,571 B2 | 5/2016 | Kemen |
| 9,368,314 B2 | 6/2016 | Nakasuji |
| 9,530,613 B2 | 12/2016 | Rogers |
| 9,536,702 B2 | 1/2017 | Lang |
| 9,607,805 B2 | 3/2017 | Liu |
| 9,653,254 B2 | 5/2017 | Zeidler |
| 9,702,983 B2 | 7/2017 | Eder |
| 9,922,799 B2 | 3/2018 | Li |
| 9,991,089 B2 | 6/2018 | Mueller |
| 10,062,541 B2 | 8/2018 | Ren |
| 10,141,160 B2 | 11/2018 | Ren |
| 10,354,831 B2 | 7/2019 | Kemen |
| 10,388,487 B2 | 8/2019 | Zeidler |
| 10,535,494 B2 | 1/2020 | Zeidler |
| 10,541,112 B2 | 1/2020 | Schubert |
| 10,586,677 B1 | 3/2020 | Okada |
| 10,600,613 B2 | 3/2020 | Zeidler |
| 10,622,184 B2 | 4/2020 | Knippelmeyer |
| 10,643,820 B2 | 5/2020 | Ren |
| 10,741,355 B1 | 8/2020 | Zeidler |
| 10,811,215 B2 | 10/2020 | Zeidler |
| 10,854,423 B2 | 12/2020 | Sarov |
| 10,879,031 B2 | 12/2020 | Ren |
| 10,896,800 B2 | 1/2021 | Riedesel |
| 11,657,999 B2 | 5/2023 | Zeidler et al. |
| 2005/0077475 A1 | 4/2005 | Nagae et al. |
| 2009/0014649 A1 | 1/2009 | Nakasuji |
| 2012/0295202 A1 | 11/2012 | Sano |
| 2014/0197325 A1 | 7/2014 | Kato |
| 2014/0224985 A1 | 8/2014 | Rodgers et al. |
| 2015/0357157 A1 | 12/2015 | Mueller et al. |
| 2016/0247663 A1 | 8/2016 | Schubert et al. |
| 2016/0268096 A1 | 9/2016 | Ren et al. |
| 2016/0284505 A1* | 9/2016 | Ren .................. H01J 37/28 |
| 2017/0133198 A1 | 5/2017 | Kruit |
| 2017/0154756 A1 | 6/2017 | Ren et al. |
| 2018/0158642 A1 | 6/2018 | Frosien et al. |
| 2019/0333732 A1 | 10/2019 | Ren |
| 2020/0211810 A1 | 7/2020 | Zeidler |
| 2020/0243300 A1 | 7/2020 | Zeidler |
| 2020/0373116 A1 | 11/2020 | Zeidler |
| 2021/0005423 A1 | 1/2021 | Zeidler |
| 2021/0035773 A1 | 2/2021 | Zeidler |
| 2021/0313137 A1 | 10/2021 | Zeidler et al. |

FOREIGN PATENT DOCUMENTS

| | | |
|---|---|---|
| CN | 107210176 A | 9/2017 |
| DE | 10 2013 014 976 A1 | 3/2015 |
| DE | 10 2013 016 113 A1 | 3/2015 |
| DE | 10 2014 008 105 A1 | 12/2015 |
| DE | 10 2015 202 172 A1 | 8/2016 |
| DE | 10 2014 008 083 B4 | 8/2017 |
| DE | 10 2018 202 421 B3 | 7/2019 |
| EP | 2579269 A2 | 4/2013 |
| GB | 2519511 A | 4/2015 |
| GB | 2521819 A | 7/2015 |
| JP | 59184524 A | 10/1984 |
| JP | 60042825 A | 3/1985 |
| JP | 60105229 A | 6/1985 |
| JP | 61263217 A | 11/1986 |
| JP | 09-288991 A | 11/1997 |
| JP | 2005-057110 A | 3/2005 |
| JP | 2009-507351 A | 2/2006 |
| JP | 2006-210458 A | 8/2006 |
| JP | 2012-243802 A | 12/2012 |
| JP | 2014-013759 A | 1/2014 |
| JP | 2014229481 A | 12/2014 |
| TW | 201130010 A | 9/2011 |
| TW | 201527745 A | 7/2015 |
| WO | WO 2005/024881 A2 | 3/2005 |
| WO | WO 2007/028595 A2 | 3/2007 |
| WO | WO 2007/028596 A1 | 3/2007 |
| WO | WO 2007/060017 A2 | 5/2007 |
| WO | WO2013032949 A1 | 3/2013 |
| WO | WO 2016/124648 | 8/2016 |
| WO | WO 2016/124648 A1 | 8/2016 |
| WO | WO2020057678 A1 | 3/2020 |
| WO | WO2020064035 A1 | 4/2020 |
| WO | WO2020065094 A1 | 4/2020 |
| WO | WO2020070074 A1 | 4/2020 |
| WO | WO2020151904 A2 | 7/2020 |
| WO | WO2020249147 A1 | 12/2020 |

OTHER PUBLICATIONS

Japanese Office Action, with translation thereof, for corresponding JP Appl. No. 2020-571464 dated Feb. 13, 2023.

(56) References Cited

OTHER PUBLICATIONS

Japanese Office Action, with translation thereof, for corresponding JP Appl. No. 2022-042741 dated Feb. 24, 2023.
Taiwanese Office Action, with translation thereof, for corresponding TW Appl. No. 108121814 dated Mar. 8, 2023.
Korean Office Action, with translation thereof, for corresponding KR Appl No. 10-2021-7001733, dated Jun. 17, 2023.
China National Intellectual Property Administration (CNIPA) Office Action, with translation thereof, for corresponding CN Appl No. 201980041458.2, issued Aug. 30, 2023.
A. L. Eberle et al., "High-resolution, high-throughput imaging with a multibeam scanning electron microscope", Journal of Microscopy, vol. 259, Issue 2, 2015, pp. 114-120.
German Office Action, with translation thereof, for corresponding DE application No. 10 2018 115 012.1 dated Feb. 28, 2019.
Translation of International search report for corresponding international application No. PCT/EP2019/066058 dated Apr. 14, 2020.
D. Preikszas et al., "Procedures for minimizing the aberrations of electromagnetic compound lenses," Optik 100, No. 4 (1995) 179-187.
Translation of International Preliminary Report on Patentability for corresponding international application No. PCT/EP2019/066058 dated Dec. 30, 2020.
Japanese Office Action, with translation thereof, for corresponding JP Appl No. 2020-571464, dated Jun. 29, 2022.
China National Intellectual Property Administration (CNIPA) Office Action, with translation thereof, for corresponding CN Appl No. 201980041458.2, dated Apr. 29, 2024.
Japanese Office Action, with translation thereof, for corresponding JP Appl No. 2020-571464, dated Dec. 16, 2021.
Korean Office Action, with translation thereof, for corresponding KR Appl No. 10-2021-7001733, dated Oct. 13, 2022.

* cited by examiner

PARTICLE BEAM SYSTEM

CROSS-REFERENCE TO RELATED APPLICATION

This application is a continuation of, and claims priority under 35 U.S.C. § 120 to, international patent application PCT/EP2019/066058, filed Jun. 18, 2019, which claims benefit under 35 U.S.C. § 119 of German patent application 10 2018 115 012.1, filed Jun. 21, 2018. The entire contents of these applications are incorporated by reference herein.

FIELD

The disclosure relates to particle beam systems which operate with a multiplicity of particle beams.

BACKGROUND

WO 2005/024881 A2 and DE 10 2014 008 083 B4, for example, disclose electron microscopy systems which operate with a multiplicity of electron beams in order that an object to be examined is scanned in parallel by the electron beams. The electron beams are generated by an electron beam generated by an electron source being directed onto a multi-aperture plate having a multiplicity of openings. One portion of the electrons of the electron beam impinges on the multi-aperture plate and is absorbed there, and another portion of the electrons passes through the openings of the multi-aperture plate, such that an electron beam is shaped in the beam path downstream of each opening, the cross section of the electron beam being defined by the shape of the opening. Furthermore, suitably chosen electrical fields provided in the beam path upstream and/or downstream of the multi-aperture plate have the effect that each opening of the multi-aperture plate acts as a lens on the electron beam passing through the opening, such that a real or virtual focus arises in a plane outside the multi-aperture plate. The plane in which the foci of the electron beams are formed is imaged by an imaging optical unit onto a surface of an object to be examined, such that the individual electron beams impinge on the object in a focused manner as a bundle of primary beams alongside one another. There they generate backscattered electrons or secondary electrons emanating from the object, which electrons are shaped to form a bundle of secondary beams and are directed onto a detector array by a further imaging optical unit. There each of the secondary beams impinges on a separate detector element such that the electron intensities detected by the detector elements provide information concerning the object at the location at which the corresponding primary beam impinges on the object. The multiplicity of primary beams is scanned systematically in parallel over the surface of the object in order to generate an electron micrograph of the object in the manner that is customary for scanning electron microscopes.

SUMMARY

It has been found that the electron micrographs obtained via the individual electron beams, particularly in the case of greatly structured objects, depend on what position is occupied by the respective electron beam within the bundle of the multiplicity of electron beams. The inventors have attributed this to the fact that the individual electron beams do not all impinge on the object orthogonally, but rather at different angles, wherein the angle at which a given electron beam impinges on the object depends on the position of the electron beam within the bundle of electron beams. The inventors have thus recognized that the imaging of the plane in which the foci of the electron beams are formed onto the object is not telecentric. The desire therefore arose to influence the telecentricity of the imaging of the plane of the foci onto the object. Since a telecentricity error usually increases with increasing distance from a centre of an image field, the desire furthermore arose to influence the size of the illuminated field on the object by virtue of the distance between the individual beams at the object being changeable.

The present disclosure proposes a particle beam system which operates with a multiplicity of particle beams and in which angles and distances between particle beams within the bundle of particle beams are able to be influenced.

In accordance with embodiments of the present disclosure, a particle beam system includes a multi-beam particle source configured to generate a multiplicity of particle beams. The multi-beam particle source can include for example a particle emitter for generating a particle beam and a multi-aperture plate, which is arranged in the beam path of the particle beam and which has a multiplicity of openings through which particles of the particle beam pass, such that the multiplicity of particle beams is generated in the beam path downstream of the multi-aperture plate.

The particle beam system furthermore includes an imaging optical unit configured to image an object plane particle-optically into an image plane and to direct the multiplicity of particle beams onto the object plane. The imaging of the object plane into the image plane does not preclude one or more intermediate image planes, in which images of the object plane are generated, also being arranged in the beam path between the object plane and the image plane.

The particle beam system furthermore includes a field generating arrangement configured to generate electric and/or magnetic deflection fields of adjustable strength in regions near the object plane, wherein the particle beams are deflected during operation by the deflection fields by deflection angles dependent on the strength of the deflection fields.

The particle beam system, by setting the deflection angles near the object plane, allows the angles at which the particle beams pass through the image plane to be influenced.

The deflection angle by which an individual particle beam is deflected by the deflection field can be determined as the angle between two straight lines, wherein one of the two straight lines coincides with the trajectory of the particle beam in the beam path directly upstream of the deflection field and the other of the two straight lines coincides with the trajectory of the particle beam in the beam path directly downstream of the deflection field. A deflection angle of zero results in this case if the particle beam is not deflected by the deflection field. The deflection fields extend in the direction of the beam path over an extensive region. Accordingly, the deflection fields act on the particle beams over an extensive region and have the effect that the trajectory in the region of the deflection fields runs along a curved path.

The object that is intended to be illuminated with the particle beams can be arranged in the image plane. The above-explained foci of particle beams, which can be formed in the beam path of the particle beams, can also be generated in the object plane or near the object plane. However, the particle beam system is not restricted to such configurations.

The deflection fields of the field generating arrangement are generated in the beam path near the object plane, which is imaged onto the image plane by the imaging optical unit. The arrangement near the object plane encompasses the fact that a distance between a plane in which the effect of the deflection fields can be localized and the actual object plane given by the imaging optical unit onto the image plane, in which the object is arranged, is less than 0.1 times (e.g., less than 0.05 times) the distance between the object plane and the image plane.

As explained above, the deflection fields extend in the direction of the beam path of the particle beam to be deflected over an extensive region. The deflecting effect of the deflection fields on the particle beam can be localized for example to the plane in which the vertex of the deflection angle is arranged if the latter is determined as explained above.

If a particle beam passing through the field generating arrangement is deflected by the latter by different deflection angles dependent on the strength of the deflection field generated for this particle beam, then such changes in the deflection angle in the image plane have the effect that only the angle at which the respective particle beam impinges on the image plane changes, while the location of the incidence of the particle beam on the image plane is substantially not altered by changes in the deflection angle. By setting the deflection fields, it is thus possible for the angles at which the particle beams impinge on the image plane to be set in a targeted manner. For example, it is then possible to excite the deflection fields in such a way that all particle beams of the multiplicity of particle beams are incident on the image plane substantially orthogonally, i.e. telecentrically. This then has the effect that in the case of the particle beam system used as a microscope, images captured via individual particle beams, even in the case of greatly structured objects, are not significantly dependent on the position of a respective particle beam within the bundle of particle beams.

For particle beam systems which operate with a multiplicity of particle beams it is conventional practice to use magnetic objective lenses designed such that the focusing magnetic field acts on the particle beams substantially only within the lens body and magnetic leakage fields extending from the lens body to the object are as small as possible. In accordance with exemplary embodiments of the disclosure, the particle beam system includes the field generating arrangement explained above and an imaging optical unit including an objective lens, which provides a focusing magnetic field having at the image plane a magnetic field strength that is greater than 20 mT (e.g., greater than 50 mT, greater than 150 mT). Such objective lenses are conventionally referred to as magnetic immersion lenses. Magnetic immersion lenses are usually realized by the hole in the outer pole shoe of the lens having a larger diameter than the hole in the inner pole shoe of the lens. In contrast to objective lenses which provide only a low magnetic field at the object, these lenses have the advantage of being able to achieve lower spherical and chromatic aberrations, and also the disadvantage of greater off-axis aberrations. On the other hand, the strong magnetic field present at the surface of the object has the effect that particle beams impinging on the object at a distance from the optical axis of the objective lens are not incident on the object orthogonally and, accordingly, particle beams starting from the object do not emanate orthogonally from the object, which can lead to problems, e.g., in the case of greatly structured objects. The use of the field generating arrangement now allows the particle beams to be deflected near the object plane such that they are incident on the object orthogonally despite the magnetic field present at the surface of the object. Furthermore, this also compensates for the off-axis aberrations of the immersion lens which conventionally constitute a disadvantage of the immersion lens. For example, the off-axis aberrations typically increase linearly with the distance from the optical axis. Likewise, the angular deviations from the orthogonal incidence of the beams on the object plane, i.e. the telecentricity error, also increase proportionally with the distance from the optical axis. Calculations reveal that with the correction of the telecentricity error, at the same time the off-axis aberrations are also largely reduced. It is thus possible to use so-called immersion lenses in multi-beam particle systems whose beams are incident on the object at a distance from the optical axis of the objective lens, and to fully utilize the possibilities thereof for reducing aberrations.

Since the individual particle beams are focused onto the object plane, the trajectories of the particles of a given particle beam converge toward the object plane. This means that even in the case of a particle beam which is incident on the object plane orthogonally, the trajectories of the particles incident on the object plane are not all oriented orthogonally to the object plane. However, the angle of incidence of a particle beam on a plane is usually determined on the basis of the so-called centroid ray of the particle beam. The centroid ray represents the fictitious sum of the trajectories of all particles of the particle beam.

In accordance with exemplary embodiments, the multi-beam particle source includes a multiplicity of particle emitters which are arranged alongside one another near the object plane and each of which generates one particle beam or a plurality of particle beams of the multiplicity of particle beams. In this case, the field generating arrangement can include a magnetic coil configured to generate a magnetic field in which the particle emitters are arranged and the field direction of which in the object plane is oriented orthogonally to the object plane.

The inventors have furthermore recognized that an error in the telecentricity of the imaging of the field of incidence locations at the object onto the deflector array has the effect that images obtained using individual particle beams are dependent on what position is occupied by the respective particle beam within the field of particle beams.

In accordance with further exemplary embodiments of the disclosure, a particle beam system therefore includes an illumination system configured to direct a multiplicity of particle beams onto an object plane, such that there the particle beams illuminate a multiplicity of incidence locations, and an imaging optical unit configured to direct a multiplicity of particle beams emanating from the object plane onto a detector array. In this case, the detector array can be arranged in an image plane into which the object plane is imaged particle-optically by the imaging optical unit. The imaging optical unit images the object plane into an intermediate image plane and generates an image of the object plane there. The particle beam system furthermore includes a field generating arrangement configured to generate electric and/or magnetic deflection fields of adjustable strength in regions near the intermediate image plane, wherein the particle beams are deflected during operation by the deflection fields by deflection angles dependent on the strength of the deflection fields.

If the telecentricity of the particle beams starting in the object plane is disturbed for example by local electric fields, i.e. if individual particle beams move away from the object plane in a direction which is not oriented orthogonally to the object plane, this can have the effect that particles emanating from a given incidence location at the object do not impinge on that detector element of the detector array which is assigned to the incidence location, but rather on an adjacent detector element different than the detector element. The signal detected by the adjacent detector element may then incorrectly not be assigned to the given incidence location. This problem is usually referred to as "crosstalk" between the particle beams. In order to reduce this problem, use is usually made of a stop arranged in the region of a beam crossover of the particle beams between the object and the detector array. the stop absorbs particles which move on trajectories which lead to a detector element which is not assigned to the incidence location from which the particles emanate. In order to achieve a reliable filtering, a diameter of the opening of the stop should be chosen as small as possible. However, this presupposes that all beams which pass through the plane in which the stop is arranged start from the object plane at substantially identical angles. What may actually occur, however, is that particle beams emanating from the incidence locations start from the object at angles which are dependent on the position of the respective particle beam within the bundle of particle beams.

The effect of these angles on the trajectories of the particle beams can be influenced and partly compensated for by deflections experienced by the particle beams when passing through the field generating arrangement.

The field generating arrangement arranged in the imaging optical unit between the object and the detector array can have a construction which is identical or similar to the construction of the field generating arrangement arranged in the beam path between the particle source and the object.

The arrangement near the intermediate image plane encompasses the fact here that a distance between a plane in which the effect of the deflection fields can be localized and the actual intermediate image plane, into which the object plane, in which the object is arranged, is imaged by the imaging optical unit, is less than 0.1 times (e.g., less than 0.05 times) the distance between the object plane and the intermediate image plane.

In accordance with exemplary embodiments of the disclosure, the particle beam system includes the field generating arrangement explained above and an imaging optical unit including an objective lens, which provides a focusing magnetic field having at the image plane a magnetic field strength that is greater than 20 mT (e.g., greater than 50 mT, greater than 150 mT).

In accordance with exemplary embodiments, the field generating arrangement is configured such that the legs of the deflection angle by which the one particle beam is deflected by the field generating arrangement lie in a plane whose normal is at a distance from an optical axis of the imaging optical unit which is less than 0.99 times (e.g., less than 0.95 times, less than 0.90 times) a distance between the vertex of the deflection angle and the principal axis. This means that the deflection of the beam is not effected exclusively toward or away from the principal axis, i.e. in a radial direction with respect to the principal axis, rather at least one component of the deflection is oriented in a circumferential direction with respect to the principal axis.

In this case, the optical axis of the imaging optical unit runs along the axes of symmetry of the rotationally symmetrical lenses of the imaging optical unit, which are arranged one behind another in the beam path. In this case, it is also possible for the optical axis of the imaging optical unit to include a plurality of rectilinear regions which are not arranged on a common straight line. This is the case for example if a non-rotationally symmetrical beam deflector is arranged between two rotationally symmetrical lenses.

The above-described relation of the distance between the optical axis and the normal to the plane containing the two legs of the deflection angle means that the deflection of the deflected particle beam is not effected exclusively toward or away from the optical axis, i.e. in a radial direction with respect to the optical axis. Rather, it is demanded that at least one significant component of the deflection is implemented in a circumferential direction around the optical axis extending through the deflection arrangement. This relation can be fulfilled for example for more than 30% or more than 60% of the particle beams during the operation of the particle beam system.

Furthermore, the deflection angles can be greater than 10 μrad (e.g., greater than 50 μrad, greater than 100 μrad, greater than 300 μrad). This relation, too, can be fulfilled for example for more than 30% (e.g., more than 60%) of the particle beams during the operation of the particle beam system.

In accordance with exemplary embodiments, the deflection fields are generated in such a way that the following relation holds true for a multiplicity of pairs of the particle beams of the multiplicity of particle beams which pass through the object plane or intermediate image plane:

$$0.9 < r1/r2 * \alpha2/\alpha1 < 1.1$$

wherein r1 represents a radial distance between a location at which a first particle beam of the pair passes through the object plane or intermediate image plane and a centre in this plane, r2 represents a radial distance between a location at which a second particle beam of the pair passes through the object plane or intermediate image plane and the centre in this plane, α1 represents the absolute value of the deflection angle by which the first particle beam is deflected, and α2 represents the absolute value of the deflection angle by which the second particle beam is deflected.

This means that the size of the deflection angles increases substantially linearly with the distance from the centre or the optical axis.

The deflection of the particle beams in the object plane by deflection angles which are oriented in a circumferential direction around the optical axis of the illumination system also has the effect of enlarging the cross section of the entire bundle of particle beams in a plane—usually designated by crossover—in which the cross section of the bundle of particle beams is minimal. This in turn leads to a reduction of the mutual repulsion of the particles from one another on account of Coulomb repulsion, which in turn enables smaller beam foci in the image plane and thus an improvement in the resolving power of a multi-beam particle microscope.

In accordance with exemplary embodiments, the field generating arrangement includes a deflector array having a multiplicity of deflectors arranged alongside one another, wherein a group of particle beams passes through each of the deflectors during operation. Embodiments of suitable deflector arrays are described for example in the German Patent Application having the application number 10 2018 202 421.9, the disclosure of which in its entirety is incorporated in the present application.

In accordance with exemplary embodiments, the deflectors of the deflector array include at least one pair of electrodes situated opposite one another, between which electrodes the group of particle beams passes through the deflector. The particle beam system can include a controller configured to apply different electrical potentials to the electrodes.

The number of pairs of electrodes situated opposite one another can be, for example, equal to one or two.

In accordance with one exemplary embodiment, only one pair of opposite electrodes is provided at each of the deflectors. In this case, a straight line running through centres of the two electrodes can be oriented in such a way that it extends in a circumferential direction with respect to a centre of the deflector array. With such a deflector array, it is then possible, for example, to influence particle beams whose trajectories run spirally around a principal axis passing through the centre such that they run parallel to the principal axis after passing through the deflector array.

In accordance with exemplary embodiments, each of the deflectors includes a first and second plate, which are arranged one behind another in the beam path, wherein the first plate and the second plate each have an opening, through which the particle beams of the group of particle beams pass successively. In this case, a centre of the opening of the first plate, as viewed in the direction of the beam path, is laterally offset relative to a centre of the opening of the second plate. The particle beam system can then include a controller configured to apply mutually different electrical potentials to the first and second plates. Electric fields are then generated between the first plate and the second plate, the electric fields resulting in a deflection of the particle beams passing through the openings.

In accordance with exemplary embodiments herein, the deflector array includes a first multi-aperture plate having a multiplicity of first openings, and a second multi-aperture plate having a multiplicity of second openings, wherein each group of particle beams passes through respectively one of the first openings and one of the second openings successively. In this case, the first opening passed through and the second opening passed through, as viewed in the direction of the beam path, are once again arranged in a manner offset laterally with respect to one another.

In accordance with a further exemplary embodiment, the deflector array includes a centre, wherein the centre of the first opening, as viewed in the direction of the beam path, relative to the centre of the second opening, is offset laterally in a circumferential direction with respect to the centre of the deflector array.

Embodiments of such deflectors are explained for example in the International Patent Application WO 2007/028596 A1, the disclosure of which in its entirety is incorporated in the present application.

The number of particle beams of a group of particle beams which is deflected by a deflector of the deflector array can be two, three or more. In accordance with one exemplary embodiment, each group includes just a single particle beam, such that a separate deflector of the deflector array is provided for each of the particle beams of the multiplicity of particle beams.

In accordance with a further embodiment of the present disclosure, a particle beam system includes an illumination system configured to direct a multiplicity of particle beams onto an object plane, such that there the particle beams illuminate a field of incidence locations. The illumination system includes a multi-aperture plate arranged in a beam path of the particle beams and having a multiplicity of openings, wherein a particle beam passes through each of the openings, and a first single-aperture plate having an opening, through which the multiplicity of particle beams passes, wherein the first single-aperture plate is arranged at a first distance from the multi-aperture plate. The illumination system furthermore includes a second single-aperture plate having an opening, through which the multiplicity of particle beams passes, wherein the second single-aperture plate is arranged at a second distance from the multi-aperture plate. The particle beam system includes a voltage supply configured to apply to the first single-aperture plate an adjustable first electrical potential relative to the multi-aperture plate and to apply to the second single-aperture plate an adjustable second electrical potential relative to the multi-aperture plate, wherein the first distance is less than 0.5 times the second distance (e.g., less than 0.2 times the second distance, less than 0.1 times the second distance).

With a particle beam system configured in this way, it is likewise possible for influences of a telecentricity error during the illumination of an object with the multiplicity of particle beams to be influenced by virtue of a diameter of the field of particle beams being changeable at the object. This change can be achieved with a change in the electrical potentials applied to the first and second single-aperture plates by the voltage supply.

On account of a difference between the electrical potentials applied to the multi-aperture plate and the single-aperture plates, electric fields are generated at the multi-aperture plate and have the effect that the openings of the multi-aperture plate have the effects of lenses on the particle beams passing through the latter, such that the particle beams passing through the openings form beam foci in the beam path downstream or upstream of the multi-aperture plate. the beam foci can be imaged by an imaging optical unit onto a plane in which an object is arranged. This imaging onto the plane of the object typically includes an imaging aberration referred to as field curvature. In order at least partly to compensate for this aberration, the electric fields adjoining the multi-aperture plate can be generated in such a way that the beam foci lie on a curved surface rather than on a planar plane. Examples of this are described in the International Patent Application WO 2005/024881 A2, the disclosure of which in its entirety is incorporated in the present application.

The particle beam system described above makes it possible not only to influence the curvature of the surface in which the beam foci that arise are arranged, but also to change the distance between the beam foci. The change in these distances then directly results in a change in the distances between the incidence locations of the particle beams in the object plane and thus in a change in the diameter of the field of particle beams in the object plane.

In this case, a change in the voltage between the multi-aperture plate and the first single-aperture plate substantially results in a change in the curvature of the surface in which the beam foci are arranged, while a change in the voltage between the multi-aperture plate and the second single-aperture plate principally results in a change in the distances between the beam foci.

In accordance with exemplary embodiments, a diameter of the opening in the second single-aperture plate is 1.5 times or three times larger than a diameter of the opening in the first single-aperture plate.

In accordance with exemplary embodiments, the first and second single-aperture plates are arranged on a same side with respect to the multi-aperture plate. In accordance with the further exemplary embodiments, the multi-aperture plate is arranged between the first single-aperture plate and the second single-aperture plate.

In accordance with further exemplary embodiments, provision is made of at least one third single-aperture plate having an opening, through which the multiplicity of particle beams passes, wherein the third single-aperture plate is arranged at a third distance from the multi-aperture plate, the third distance being greater than the second distance. The at least one third single-aperture plate is arranged on the same side as the second single-aperture plate with respect to the multi-aperture plate. The voltage supply can apply electrical potentials to the at least one third single-aperture plate in such a way that the latter together with the second single-aperture plate acts on the particle beams as a lens having an adjustable refractive power in order to alter the distances between the beam foci.

As a result of the above-described geometric design of the single-aperture plates, i.e. as a result of the choice of the distances between the single-aperture plates and the multi-aperture plate and the choice of the diameters of the openings of the single-aperture plates, it is possible for the change in the curvature of the surface in which the beam foci are formed and the distance between the beam foci to be set in a manner largely decoupled from one another. Accordingly, provision can be made of a controller configured to receive a first input signal representing a desired curvature of the surface in which the beam foci are arranged, and to receive a second input signal representing a desired distance between the incidence locations of the particle beams in the object plane. The controller can then be configured, depending on the first input signal, to change a potential difference between the multi-aperture plate and the first single-aperture plate via the voltage supply and, on the basis of the second input signal, to change a potential difference between the multi-aperture plate and the second or third single-aperture plate via the voltage supply.

In accordance with a further embodiment of the present disclosure, a particle beam system includes an illumination system configured to direct a multiplicity of particle beams onto an object plane, such that there the particle beams illuminate a field of incidence locations. In this case, the illumination system includes a multi-beam particle source having a particle emitter configured to generate a particle beam, at least one condenser lens through which the particle beam passes, a first multi-aperture plate arranged in a beam path of the particle beam downstream of the condenser lens and having a multiplicity of openings, through which particles of the particle beam pass, such that a multiplicity of particle beams are formed in the beam path downstream of the first multi-aperture plate. The illumination system furthermore includes a second multi-aperture plate arranged in the beam path downstream of the first multi-aperture plate and having a multiplicity of openings, wherein one of the particle beams of the multiplicity of particle beams passes through each of the openings. The illumination system furthermore includes a controller configured to excite the at least one condenser lens, such that the latter provides an adjustable refractive power for the particle beam, to receive a first signal representing a desired distance between the incidence locations of the particle beams in the object plane, and to change the refractive power of the at least one condenser lens in the event of a change in the first signal.

The change in the refractive power of the condenser lens as a result of the change in the excitation of the condenser lens leads to a change in the divergence of the particle beam incident on the first multi-aperture plate, and thus also to a change in the divergence of the multiplicity of particle beams generated in the beam path downstream of the multi-aperture plate. This multiplicity of particle beams is finally directed onto the object. It is evident that, with properties of the illumination optical unit otherwise remaining the same, an increase in the divergence of the multiplicity of particle beams directly downstream of the first multi-aperture plate results in an increase in the distances between the incidence locations of the particle beams on the object and, correspondingly, a decrease in the divergence of the multiplicity of particle beams directly downstream of the first multi-aperture plate results in a decrease in the distances between the incidence locations of the particle beams on the object.

In accordance with exemplary embodiments, the illumination system is configured to focusing the particle beams respectively in the beam path downstream of the multi-aperture plate and upstream of the object plane, wherein the corresponding beam foci are arranged on a curved surface. In this case, the particle beam system furthermore includes a single-aperture plate arranged in the beam path upstream or downstream of the second multi-aperture plate and having an opening, through which the multiplicity of particle beams passes. The controller can then be configured to provide an adjustable electrical potential difference between the single-aperture plate and the multi-aperture plate, to receive a second signal representing a desired curvature of the surface, and to change the potential difference between the single-aperture plate and the multi-aperture plate in the event of a change in the second signal.

BRIEF DESCRIPTION OF THE FIGURES

The above-described features and aspects will become clearer from the following description of embodiments. However, embodiments of the disclosure need not include all of the described features, and any features which may be included need not show all of the described advantages. In the figures.

DETAILED DESCRIPTION OF EMBODIMENTS

Figure 1:
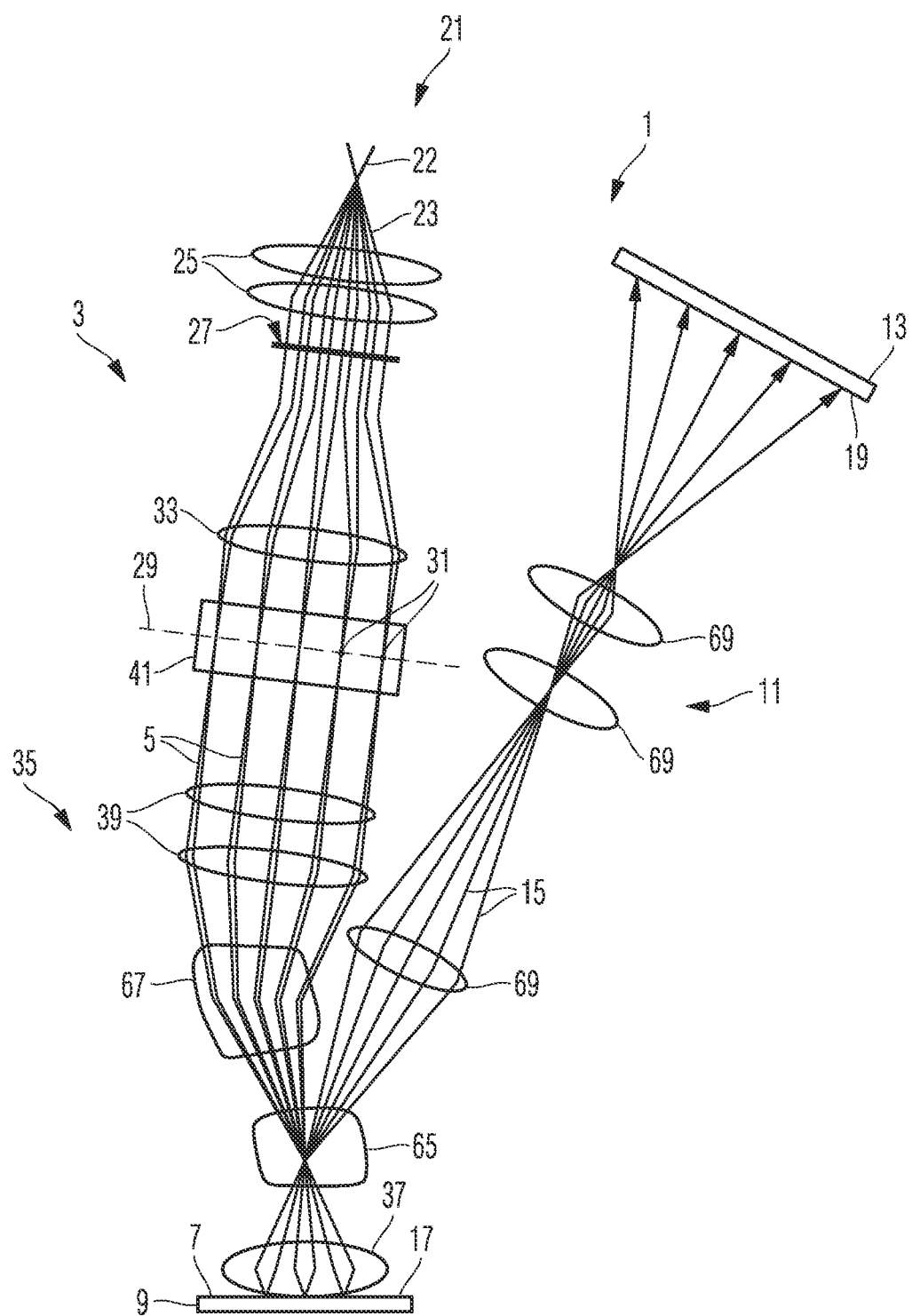
FIG. 1 shows a schematic illustration of a particle beam system.

In the following description of embodiments, components which are similar in terms of their structure and function are largely provided with the same or similar references. A particle beam system in accordance with one embodiment is illustrated schematically in FIG. 1. The particle beam system 1 includes an illumination system 3 configured to direct a multiplicity of particle beams 5 onto a plane 7 in which an object 9 is arranged. Each of the particle beams 5 illuminates an incidence location on the object 9, wherein the particle beams 5 are incident on the object 9 alongside one another and at a distance from one another, such that a field of incidence locations is illuminated there. The particle beams 5 can be electron beams, for example, which generate secondary electrons and backscattered electrons at the object 9. An imaging optical unit 11 of a detection system is configured to collect the electrons generated at the incidence locations and to direct them onto a detector array 13. Here electrons emanating from each of the incidence locations are used to shape in each case a separate particle beam 15. The particle beams 15 are directed onto the detector array 13. The detector array 13 includes an array of detector elements, wherein one or more detector elements are provided for detecting a respective one of the particle beams 15. For this purpose, the detector elements are arranged in an array corresponding to the arrangement of the incidence locations at the object 9. The imaging optical unit 11 is configured with respect to the surface of the object 9 and the detector array 13 such that the surface of the object 9 is arranged in an object plane 17 of the imaging provided by the imaging optical unit 11 and the detector elements of the detector array 13 are arranged in an image plane 19 of the imaging. The imaging optical unit 35 of the illumination system 3 and the imaging optical unit 11 of the detector system are arranged such that the image plane 7 of the imaging optical unit 35 and the object plane of the imaging optical unit 11 coincide and the surface of the object can be arranged there. The plane 7 is thus the image plane of the illumination system 3, the object plane 17 of the imaging optical unit 11 and the sample plane in which the surface of an object to be examined is arranged.

The illumination system 3 includes a multi-beam particle source 21 having a particle emitter 22 for generating a particle beam 23, which is collimated by one or more condenser lenses 25 and impinges on a multi-aperture plate arrangement 27. The multi-aperture plate arrangement 27 includes at least one multi-aperture plate having a multiplicity of openings. The particles of the particle beam 23 which pass through the openings in the multi-aperture plate form the particle beams 5. The multi-aperture plate arrangement 27 is furthermore configured to focus the individual particle beams 5, such that foci 31 of the particle beams 5 are formed in a region around a surface 29. In this case, the surface 29 can have a curved shape. Further lenses 33 that influence the beam path can be provided between the multi-aperture plate arrangement 27 and the surface 29.

The illumination system 3 furthermore includes an imaging optical unit 35 configured to image the surface 29 into the plane 7, such that the surface 29 and the plane 7 are planes that are conjugate with respect to one another in the sense of an optical imaging. The imaging optical unit 35 includes an objective lens 37, which is the lens of the imaging optical unit 35 which is arranged the closest to the plane 7. Furthermore, the imaging optical unit 35 can include further lenses 39.

The illumination system 3 directs the particle beams 5 onto the plane 7 in such a way that there the particle beams are incident on the plane 7 as far as possible orthogonally, i.e. at an angle of incidence of 90°. However, deviations from this relation arise on account of the properties of the lenses 37 and 39, such that the particle beams are incident on the plane 7 at angles of incidence that are different from 90°. For example, these directions are not identical for all of the particle beams 5, but rather can be dependent on the position of the respective particle beam 5 within the field of particle beams. The deviation of the angle of incidence from 90° may be caused by telecentricity errors of the imaging optical unit 35, for example. Furthermore, the objective lens 37 can provide its focusing effect via a magnetic field reaching as far as the surface of the object 9. The trajectories of the particle beams directly at the surface of the object then have the shape of spirals. In order at least partly to compensate for such deviations from telecentricity, a deflector array 41 is arranged near the surface 29 which is imaged into the plane 7.

Figure 3:
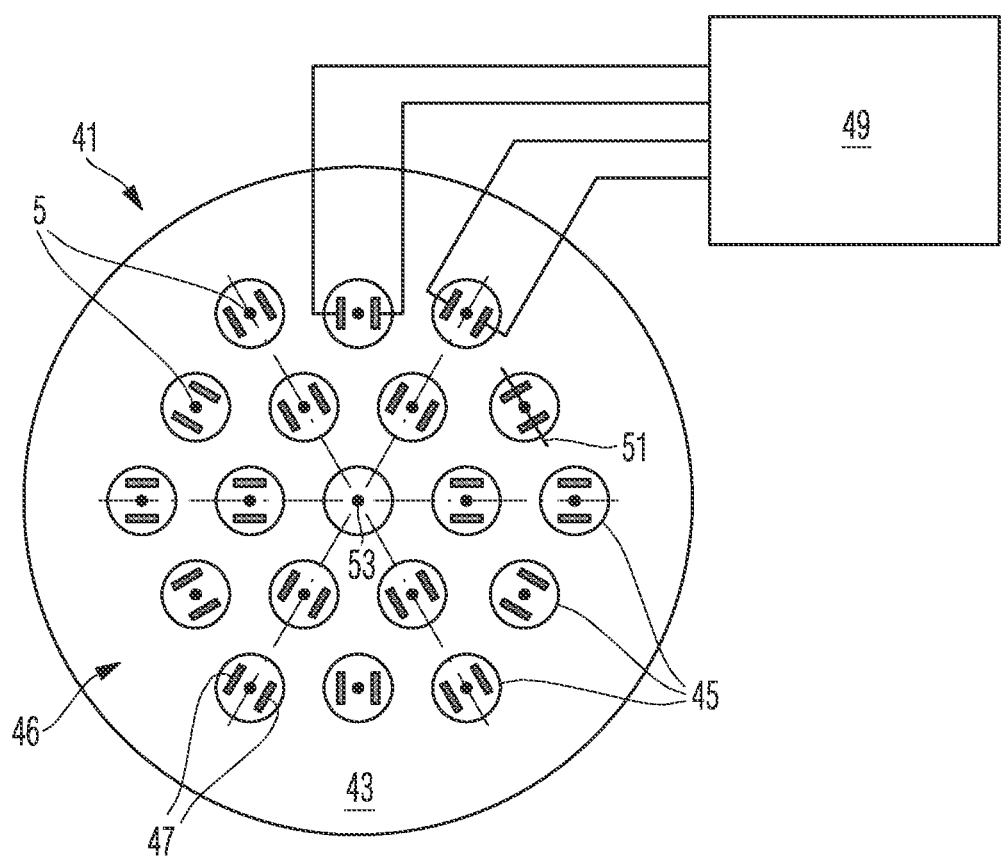
FIG. 3 shows a schematic illustration of a plan view of a deflector array which is usable in the particle beam system from FIG. 1.

A plan view of one embodiment of the deflector array 41 is illustrated schematically in FIG. 3. The deflector array 41 includes a multi-aperture plate 43 having a multiplicity of openings 45 arranged in an array 46 in such a way that one of the particle beams 5 passes centrally through each of the openings 45. At each opening 45, a pair of electrodes 47 situated opposite one another is arranged on both sides of the midpoint of the opening 45. Each electrode 47 is connected to a controller 49 configured to apply mutually different electrical potentials to the electrodes 47 of each pair of electrodes. The potential difference between the electrodes 47 of a pair of electrodes 47 generates an electric field between the electrodes 47, the electric field deflecting the particle beam 5 passing through the pair of electrodes 47 by an angle dependent on the potential difference.

The pairs of electrodes 47 are oriented with respect to the particle beams 5 passing through the latter in such a way that a connecting line 51 between centres of the two electrodes 47 of the pair is arranged in a circumferential direction with respect to a centre 53 of the array 46 of the openings 45 through which the particle beams 5 pass. As a result, it is possible to deflect the particle beams 5 such that, after passing through the deflector array 41, they run on spiral paths around a centre 53 of the field of particle beams 5. The inclination of these spiral paths can be set here such that the effect of a magnetic field extending from the objective lens 37 as far as the surface of the object 9 is compensated for, with the result that the particle beams 5 are incident on the plane 7 substantially orthogonally.

In the case of the deflector array 41 illustrated in FIG. 3, each individual deflector has a pair of electrodes 47 situated opposite one another and arranged offset in a circumferential direction with respect to the centre 53. It is thereby possible to deflect the particle beams in directions which are oriented in a circumferential direction with respect to the centre. It is also possible however for two or more pairs of electrodes situated opposite one another to be arranged in a distributed manner in a circumferential direction around the opening in order also to be able to set the orientations in which the particle beam passing through the plurality of pairs of electrodes is deflected.

Figure 4:
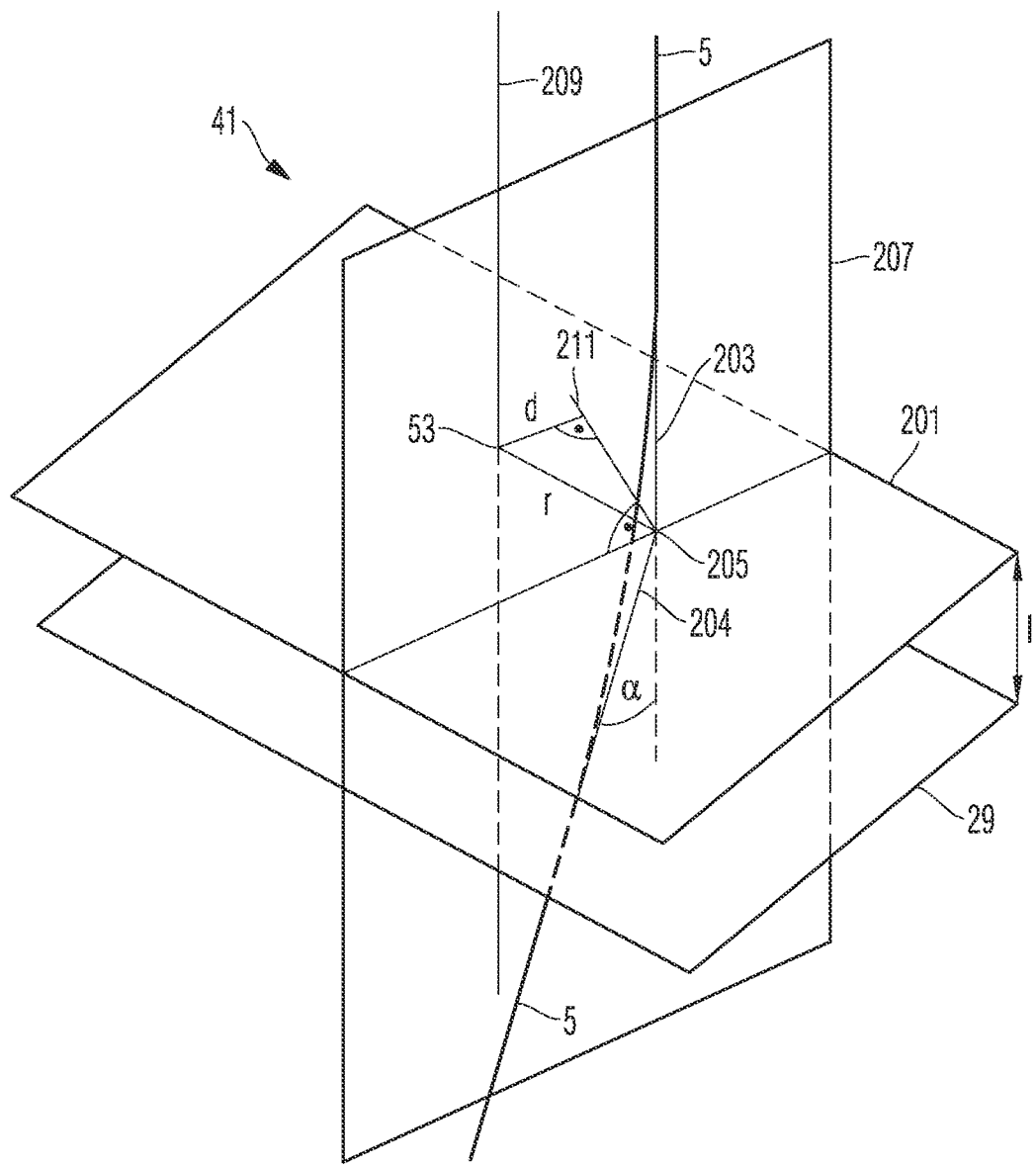
FIG. 4 shows an illustration for elucidating an orientation of a deflection of a particle beam, the deflection being produced by a field generating arrangement of the particle beam system from FIG. 1.

FIG. 4 is an illustration for elucidating the orientation of a deflection of a particle beam, the deflection being produced by a field generating device 41. A plane 201 in FIG. 4 represents the plane in which the effects of the deflection fields of the field generating arrangement 41 can be localized. The particle beam 5 enters the field generating arrangement 41 from above and emerges from the field generating device 41 at the bottom in FIG. 4. The trajectory of the particle beam 5 runs rectilinearly before entering the field generating arrangement 41 and after emerging from the field generating arrangement 41 and on a curved path within the field generating arrangement 41. Extensions 203 and 204 of the rectilinear parts of the trajectory intersect at a point 205 and form and angle α with one another. The angle α is the deflection angle by which the particle beam 5 is deflected by the deflection fields of the field generating arrangement 41. The rectilinear extensions 203 and 204 form legs of the deflection angle α, and the point 205 is the vertex of the deflection angle. The legs 203 and 204 lie in a plane 207. The plane 207 is oriented orthogonally to the plane 201 in which the effects of the deflection fields of the field generating arrangement 41 can be localized. The vertex 205 of the deflection angle is at a distance r from the centre 53 of the field generating arrangement 41. It is advantageous if an optical axis 209 of the imaging optical unit 35 passes through the centre 53 of the field generating arrangement 41. With respect to the centre 53 or the optical axis 209 of the imaging optical unit 35, the plane 207 has an orientation in such a way that a straight line 211 oriented orthogonally to the plane 207 and passing through the vertex 205 of the deflection angle α is at a distance d from the optical axis which is less than 0.99 times or 0.95 times or 0.90 times the distance r between the vertex 205 and the optical axis 209 or the centre 53. This means that the particle beam 5 is deflected by the deflection angle α, which is also oriented in a circumferential direction with respect to the optical axis 209.

FIG. 4 likewise shows the object plane 29, which is imaged into the image plane by the imaging optical unit 35. The plane 201 in which the deflecting effect on the particle beam 5 can be localized is at a distance 1 from the object plane 29 which is small in comparison with the distance along the optical axis 209 of the object plane 29 from the image plane 7. For example, the distance 1 is less than 0.1 times the distance between the object plane 29 and the image plane 7 along the optical axis 209.

Figure 5:
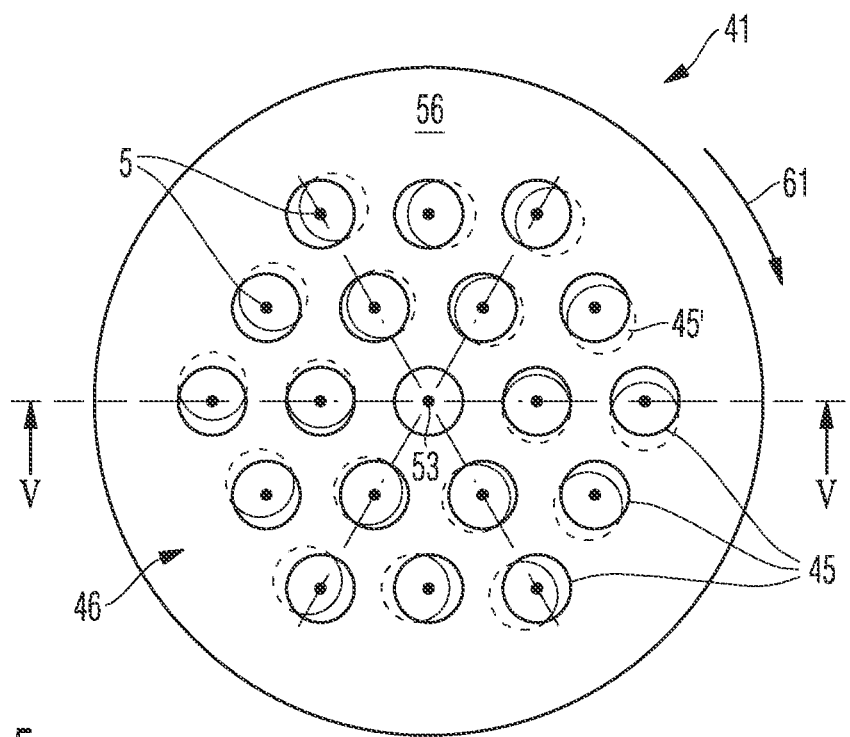
FIG. 5 shows a schematic illustration of a plan view of a further deflector array which is usable in the particle beam system from FIG. 1.
Figure 6:
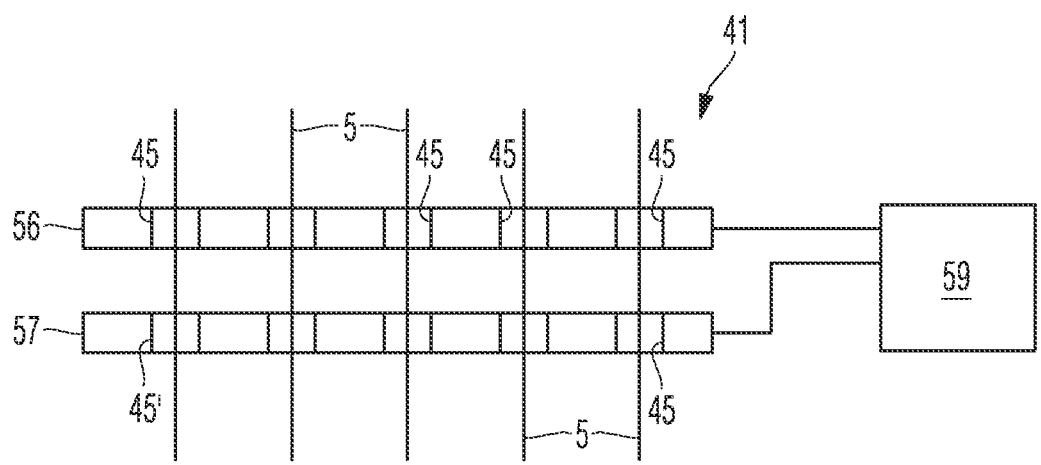
FIG. 6 shows a schematic illustration of a cross-sectional view of the deflector array illustrated in FIG. 5 along a line V-V in FIG. 5.

A further embodiment of a deflector array 41 is explained below with reference to FIGS. 5 and 6. In this case, FIG. 5 shows a plan view of the deflector array 41 and FIG. 6 shows a cross section through the deflector array 41 along a line V-V in FIG. 5.

The deflector array 41 includes a first multi-aperture plate 56 having a multiplicity of openings 45, and a second multi-aperture plate 57 having a multiplicity of openings 45', through which the particle beams 5 pass. The two multi-aperture plates 56 and 57 are arranged one behind the other in the beam path, such that each particle beam 5 passes firstly through an opening 45 in the first multi-aperture plate 56 and then through an opening 45' in the second multi-aperture plate 57. The openings 45 and 45' in the two multi-aperture plates 56 and 57 can each have an identical diameter. However, this need not be the case.

The two multi-aperture plates 56 and 57 are arranged relative to one another such that a centre of the opening 45 in the first multi-aperture plate 56, through which opening a given particle beam passes, is offset laterally relatively to a centre of the opening 45' in the second multi-aperture plate 57, through which opening the particle beam passes, as viewed in the beam direction. This is illustrated in FIG. 5 by the fact that the openings 45 in the first multi-aperture plate 56 are entirely visible and are illustrated as solid lines, while the openings 45' in the second multi-aperture plate 57 are partly concealed and, in so far as they are visible, are illustrated by solid lines and, in so far as they are concealed, are illustrated by interrupted lines.

A controller 59 is configured to apply mutually different electrical potentials to the first multi-aperture plate 56 and to the second multi-aperture plate 57. Electrostatic fields are thereby generated between the multi-aperture plates 56 and 57, the electrostatic fields deflecting the particle beams 5.

The deflection angle can be set via the potential difference between the multi-aperture plates 56 and 57 that is determined by the controller 59.

The deflector array includes a centre 53, around which the second multi-aperture plate 57 is rotated relative to the first multi-aperture plate, as is illustrated by an arrow 61 in FIG. 5. This rotation produces a lateral offset in a circumferential direction around the centre 53 between the openings 45 and 45', through which the particle beam 5 passes successively, wherein the lateral offset increases in a circumferential direction with increasing distance between the respective openings 45 and 45' and the centre 53.

By virtue of the arrangement of the deflector array 41 near the surface 29 which is imaged into the plane 7 at the surface of the object 9, it is thus possible to influence the angles of incidence of the particle beams 5 on the plane 7. For example, the angles of incidence can be set in such a way that they are approximately 90° for all of the particle beams.

The particle beam system 1 illustrated in FIG. 1 includes the illumination system 3 in order to generate the particle beams 5 and to direct them into the plane 7 in which the surface of the object 9 is arranged. Furthermore, the particle beam system 1 includes the imaging optical unit 11 in order to direct the electrons generated at the surface of the object 9 as particle beams 15 onto the detector array 13. For this purpose, the beam paths of the particle beams 5 and of the particle beams 15 are separated from one another by a beam switch 65. Between the beam switch 65 and the plane 7, the particle beams 5 and 15 traverse a common beam path, while their beam paths run separately from one another in the region above the beam switch 65 in FIG. 1. The beam switch 65 is provided by a substantially homogeneous magnetic field. The reference sign 67 in FIG. 1 denotes a region in which a homogeneous magnetic field is provided, through which the particle beams 5 pass and which is provided to compensate for imaging aberrations produced by the magnetic field of the beam switch 65 in the imaging of the surface 29 onto the plane 7.

Figure 2:
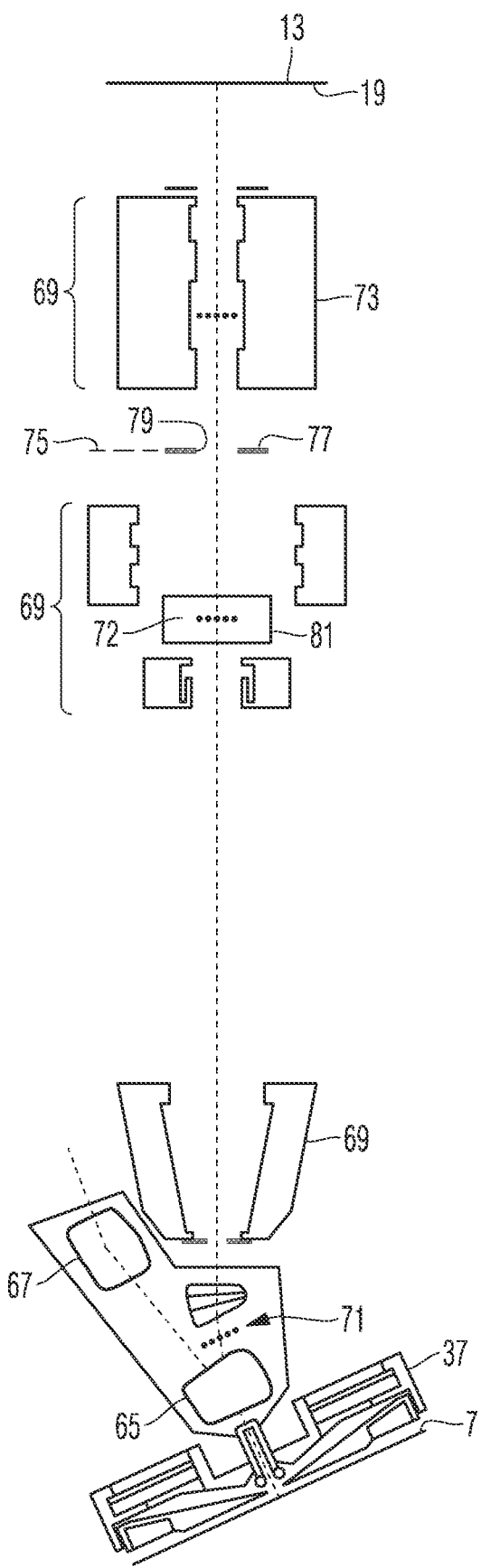
FIG. 2 shows a schematic illustration of a detail of the particle beam system from FIG. 1.

The imaging optical unit 11 includes the objective lens 37 and a plurality of lenses 69, which are illustrated schematically in FIG. 1 and in greater detail in FIG. 2. The imaging optical unit 11 images the plane 17 onto the plane 19 in which the detector elements of the detector array 13 are arranged in such a way that three intermediate images 71, 72 and 73 arise one behind another along the beam path of the particle beams 15. Furthermore, there is a crossover of the particle beams 15 in a plane 75 arranged in the beam path between the intermediate images 72 and 73. There is arranged in the plane 75 an aperture plate 77 having a cutout 79, which serves to filter out particles of the particle beams 15 which would otherwise impinge on a detector element of the detector array 13 which is different from the detector element(s) assigned to that location in the plane 7 from which the particle started.

As explained above the quality of this filtering is reduced if the particle beams 15 start from the plane 7 non-orthogonally, i.e. at angles which are different from 90°. This occurs in practice for example if the objective lens 37 generates a focusing magnetic field which reaches as far as the plane 7.

In order to compensate for this, a deflector array 81 is arranged in the region of the intermediate image 72, the deflector array including an array of deflectors, wherein one of the particle beams 15 passes through each of the deflectors. The deflectors deflect the particle beams passing through them in such a way that the latter pass through the smallest possible region in the plane 75, and the opening 79 can be chosen to be small enough to achieve a good filtering with a high throughput.

The deflector array 81 can have a construction as explained above for the deflector array 41 with reference to FIGS. 3 to 5.

Figure 7:
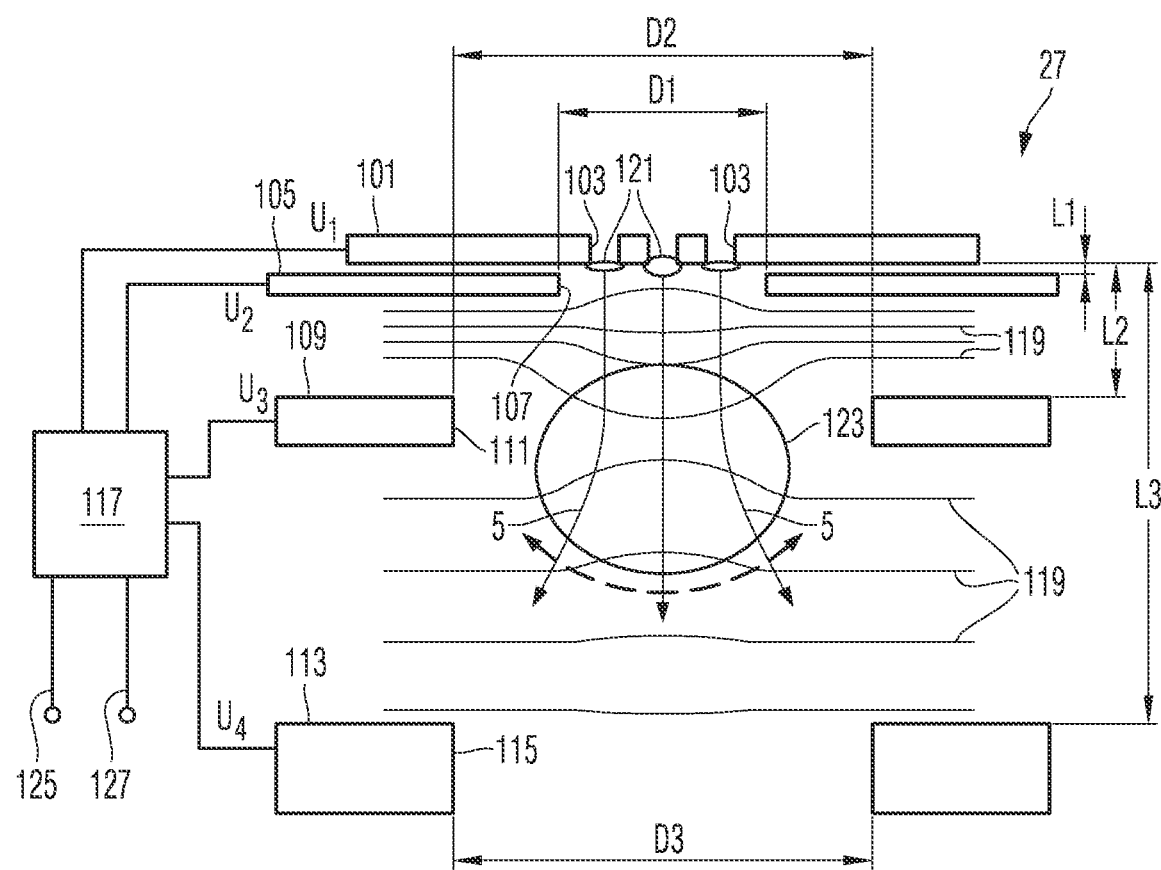
FIG. 7 shows a schematic illustration of a cross-sectional view of a detail of a multi-beam particle source which is usable in the particle beam system from FIG. 1.

FIG. 7 is a schematic illustration in cross section of one embodiment of a multi-aperture plate arrangement 27 for generating particle beams 5 in FIG. 1. The multi-aperture plate arrangement 27 includes a multi-aperture plate 101 having a multiplicity of openings 103, through which the particle beams 5 pass. In this case, the multi-aperture plate 101 can be the first multi-aperture plate in the beam path downstream of the particle source 21, such that the multi-aperture plate 101 also absorbs those particles of the particle beam 23 generated by the particle source 21 which do not contribute to the particle beams 5.

However, it is also possible for a further multi-aperture plate to be arranged upstream of the multi-aperture plate 101, the further multi-aperture plate providing this function, such that the multi-aperture plate 101 absorbs substantially no particles generated by the particle source 21. A single-aperture plate 105 is arranged at a distance L1 from the multi-aperture plate 101. The single-aperture plate 105 has an opening 107, through which all of the particle beams 5 pass.

A further single-aperture plate 109 is arranged at a distance L2 from the multi-aperture plate 101 and has an opening 111, through which likewise all of the particle beams 5 pass. The opening 111 has a diameter D2. A further single-aperture plate 113 is arranged at a distance L3 from the multi-aperture plate 101 and has an opening 115, through which likewise all of the particle beams 5 pass. The opening 115 has a diameter D3. The controller 117 is configured to apply different electrical potentials to the multi-aperture plate 101 and the single-aperture plates 105, 109 and 113. In this case, the single-aperture plate 113 can also be connected to a beam pipe, which can be at earth potential, for example.

As a result of the different electrical potentials applied to the multi-aperture plate 101 and the single-aperture plates 105, 109 and 113, inhomogeneous electric fields are generated between these plates, as is illustrated by field lines 119 in FIG. 7.

The electric field extending to the multi-aperture plate 101 has the effect that the openings 103 in the multi-aperture plate 101 act as lenses on the particle beams 5 passing through the openings 103. This lens effect is represented by ellipses 121 in FIG. 7. On account of the inhomogeneity of the electric field, the central opening 103 in the array of openings 103 in the multi-aperture plate 101 provides the strongest lens effect, while this lens effect decreases with increasing distance from the centre. This has the effect that the beam foci 31 (cf. FIG. 1) do not lie in a plane but rather in a convexly curved plane from the viewpoint of the particle source. The shape and the magnitude of the curvature of this plane are determined by the strength and the inhomogeneity of the electric field at the multi-aperture plate 101. The inhomogeneity in turn is substantially determined by the diameter D1 of the opening 107 in the single-aperture plate 105 and by the distance L1 between the multi-aperture plate 101 and the single-aperture plate 105. These variables D1 and L1 are chosen such that the resultant shape of the curvature of the surface 29 in which the beam foci 31 are arranged can compensate for a field curvature of the imaging optical unit 35, such that the foci of the particle beams 5 at the surface of the object 7 substantially all arise very near to the plane 7. Furthermore, the magnitude of the curvature of the plane 29 is determined by the potential difference between the multi-aperture plate 101 and the single-aperture plate 105.

The distance L2 between the single-aperture plate 109 and the multi-aperture plate 101 is significantly greater than the distance L1 between the single-aperture plate 105 and the multi-aperture plate 101. For example, the distance L2 is more than two times (e.g., more than five times, more than ten times) greater than the distance L1. The diameter D2 of the opening 111 in the single-aperture plate 109 is furthermore significantly larger than the diameter D1 of the opening 107 in the single-aperture plate 105. By way of example, the diameter D2 is more than 1.5 times (e.g., more than three times) larger than the diameter D1. The distance L3 between the single-aperture plate 113 and the multi-aperture plate 101 is likewise significantly greater than the distance L1 between the single-aperture plate 105 and the multi-aperture plate 101. The distance L3 is furthermore greater than the distance L2. The diameter D3 of the opening 115 of the single-aperture plate 113 is likewise significantly larger than the diameter D1 of the opening 107 in the single-aperture plate 105. The diameter D3 can be approximately equal to the diameter D2.

The inhomogeneous electric field formed in the beam path downstream of the single-aperture plate 105 provides the effect of a lens on the totality of the particle beams 5, as is illustrated by an ellipse 123 in FIG. 7. The effect of the lens changes the divergence and/or convergence of the particle beams 5 relative to one another. The strength of the effect of this lens 123 can be set by changing the voltages between the single-aperture plates 105, 109 and 113. A change in the strength of this lens 123 results in a change in the distance between the beam foci 31 on the surface 29.

With the aid of the multi-aperture plate arrangement 27, it is thus possible firstly to compensate for the field curvature of the imaging optical unit 35 and secondly to set the distance between the beam foci 31 in the plane 29. In this case, the controller 117 can have a first signal input 125, via which a desired magnitude of the compensation of the field curvature can be input to the controller 117, and the controller 117 can have a second signal input 127, via which a desired distance between the beam foci 31 in the surface 29 or a desired distance between the incidence locations of the particle beams in the plane 7 can be input to the controller 117. On account of the described configuration of the multi-aperture plate arrangement 27, the effects of the lenses 121 are adjustable in a manner largely decoupled from the effect of the lens 123. In the event of a change in the signal applied to the first signal input 125, the controller 117 can then change the voltage between the multi-aperture plate 101 and the single-aperture plate 105 in order to set the curvature of the surface 29. In the event of a change in the control signal applied to the second signal input 127, the controller 117 can then substantially change the electrical potential applied to the single-aperture plate 109 in order to change the distance between the incidence locations of the particle beams on the surface of the object 9.

Parameters of the multi-aperture plate arrangement 27 in FIG. 7 in accordance with one exemplary embodiment are indicated below:

Kinetic energy of the particle beams 5 before passing through the multi-aperture plate 101: 30 keV;
distance between the openings 103: 100 µm;
Diameter of the openings 103: 30 µm;
Focal length of the lenses 121: 100 mm to 300 mm;
D1: 4 mm;
D2: 16 mm;

D3: 6.5 mm;
L1: 0.2 mm;
L2: 7.3 mm;
L3: 65 mm,
U1: 0;
U2 500 V;
U3: 17.5 kV;
U4: 0; and
Distance between the foci in the plane 29: 200 μm to 300 μm.

Figure 8:
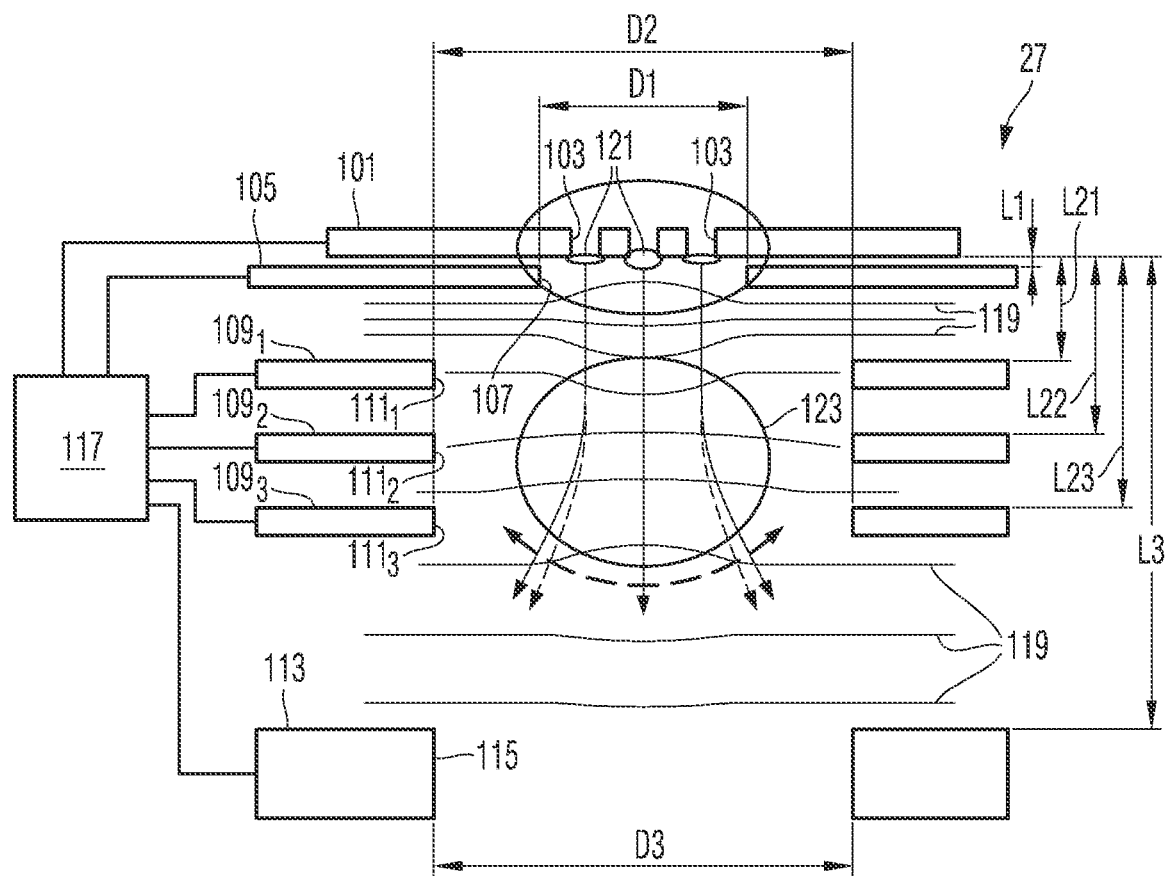
FIG. 8 shows a schematic illustration of a cross-sectional view of a detail of a further multi-beam particle source which is usable in the particle beam system from FIG. 1.

FIG. 8 is a schematic illustration in cross section of a further embodiment of a multi-aperture plate arrangement 27 for generating the particle beams 5 in FIG. 1. The multi-aperture plate arrangement 27 in FIG. 8 has a similar construction to that in FIG. 7. For example, a single-aperture plate 105 having an opening 107 having a diameter D1 is arranged at a distance L1 from a multi-aperture plate 101. Likewise, a single-aperture plate 113 having an opening 115 having a diameter D3 is arranged at a distance L3 from the multi-aperture plate 101. However, instead of the one single-aperture plate 109 in FIG. 7, provision is made of three single-aperture plates $109_1$, $109_2$ and $109_3$ having openings $111_1$, $111_2$ and, $111_3$ respectively having diameter D2, which are arranged at distances $L2_1$, $L2_2$ and $L2_3$, respectively, from the multi-aperture plate 101.

Once again L1 is significantly less than $L2_1$ and L3, and D1 is significantly less than D2 and D3. The differences between $L2_2$ and $L2_1$ and between $L2_3$ and $L2_2$ can be for example somewhat smaller than $L2_1$.

Figure 9:
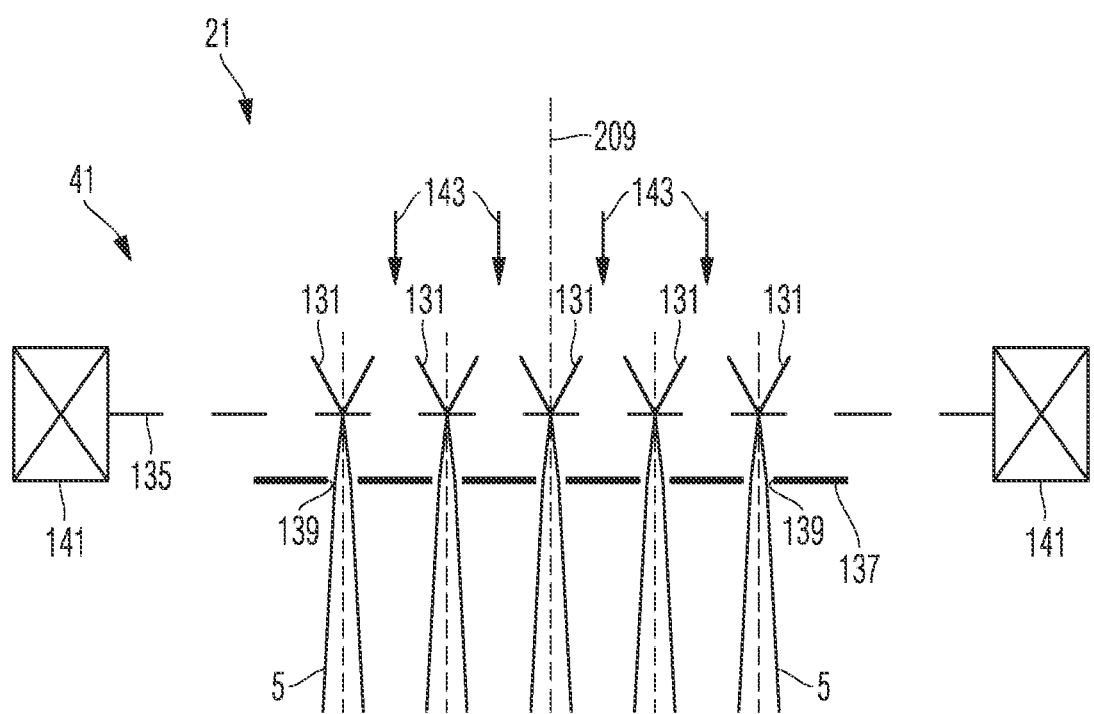
FIG. 9 shows a schematic illustration of a cross-sectional view of a detail of a further multi-beam particle source which is usable in the particle beam system from FIG. 1.

FIG. 9 is a schematic illustration in cross section of a further embodiment of a multi-beam particle source 21. The multi-beam particle source 21 includes a multiplicity of particle emitters 131 arranged in a plane 135. A multi-aperture plate 137 is arranged at a distance from the plane 135. The multi-aperture plate 137 is at positive potential relative to the particle emitters 131 in order to extract electrons from the particle emitters 131. the electrons are accelerated from the particle emitters 131 towards the multi-aperture plate 137 and pass through the latter through openings 139 in the multi-aperture plate 137 in order to shape the multiplicity of particle beams 5. The particle emitters 131 are arranged within a field generating arrangement 41. The field generating arrangement 41 is formed by a coil 141, through which current flows in order to generate a magnetic field whose field lines 143 permeate the plane 135 substantially orthogonally. In the region of the particle emitters 131, the magnetic field is a substantially homogeneous magnetic field.

The particle beams 5 start at the particle emitters 131 substantially parallel to the field lines 143 of the magnetic field and are not yet deflected here by the magnetic field. However, the particle beams 5 then traverse a region of the magnetic field in which the field lines 143 diverge. There the particle beams 5 experience a deflection by deflection angles oriented in a circumferential direction around an optical axis 209 of the imaging optical unit 35.

The plane 135 in which the particle emitters 131 are arranged is imaged into the image plane 7 by the imaging optical unit 35. The excitation of the coil 141 then makes it possible to set the angles at which the particle beams 5 are incident on the image plane. For example, it is thus possible to set the telecentricity of the incidence of the particle beams 5 in a circumferential direction around the optical axis 209 and to compensate for a telecentricity error produced by the magnetic field of the objective lens 37 at the object 17.

Figure 10:
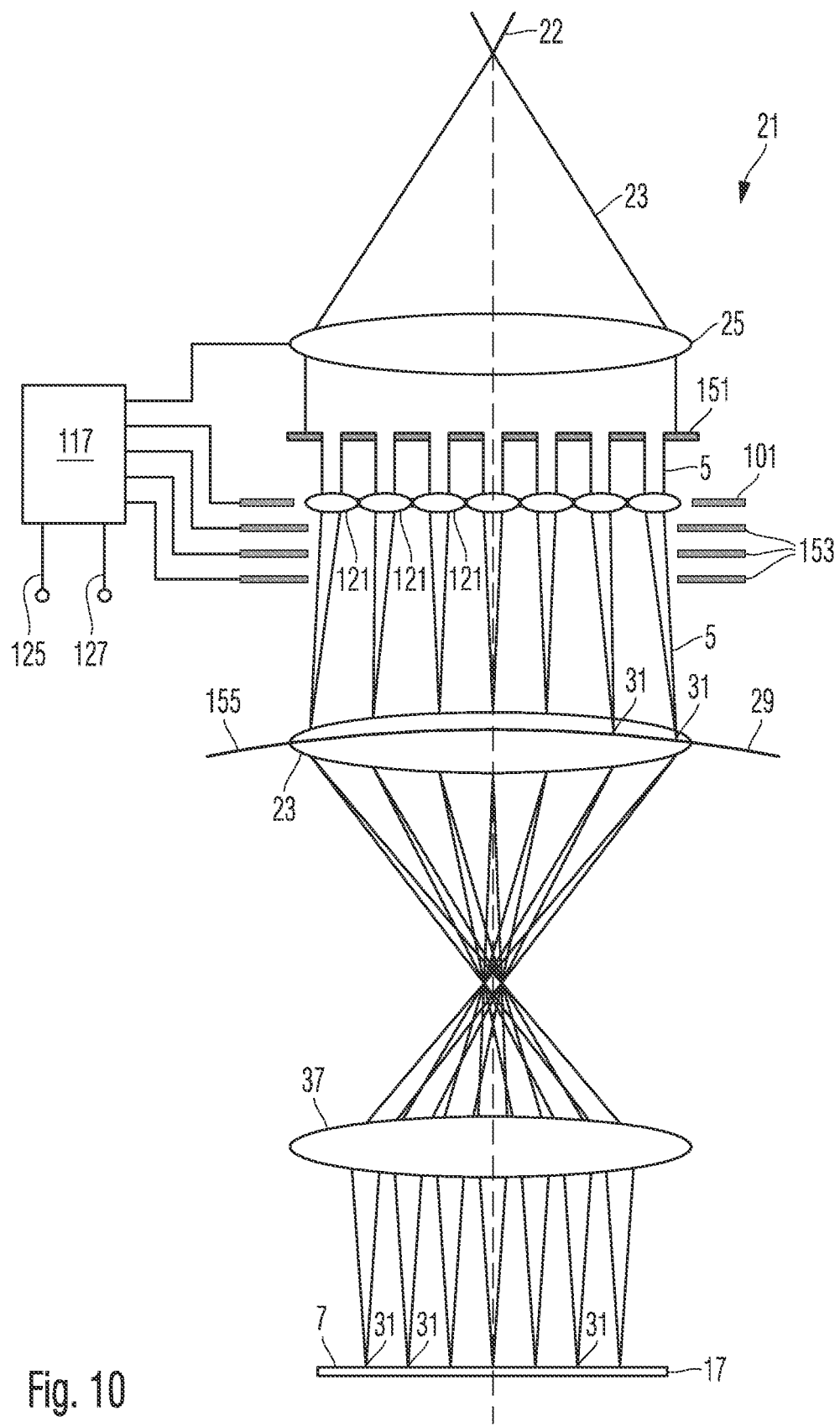
FIG. 10 shows a schematic illustration of a cross-sectional view of a detail of a further multi-beam particle source which is usable in the particle beam system from FIG. 1.

FIG. 10 is a schematic illustration of a further embodiment of a particle beam system 1 including an illumination system 3 having a multi-beam particle source 21. The multi-beam particle source 21 includes a particle emitter 22 for generating a particle beam 23, which passes through a condenser lens 25 and then impinges on a multi-aperture plate 151 having openings, through which particles of the particle beam 23 pass in order to form the multiplicity of particle beams 5 downstream of the multi-aperture plate 151. A further multi-aperture plate 101 is arranged in the beam path downstream of the multi-aperture plate 151 and has openings, through which the particle beams 5 likewise pass. One or more single-aperture plates 153 are arranged in the beam path downstream of the further multi-aperture plate 101.

As explained above in association with FIGS. 7 and 8, the openings of the further multi-aperture plate 101 act like lenses on the particle beams 5 passing through the latter, the lenses likewise being illustrated as ellipses 121 in FIG. 10, in order to focus the particle beams in a curved plane 155 at locations 31, the plane also being the object plane 29, which is imaged by an imaging optical unit 35 onto an image plane 7, in which an object 17 can be arranged.

A controller 117 is provided in order to set the potentials of the further multi-aperture plate 101 and of the single-aperture plates 153 and an excitation of the condenser lens 25. The controller 117, like the controllers of the embodiments explained with reference to FIGS. 7 and 8, includes a signal input 125 at which a desired magnitude of the compensation of the field curvature can be input to the controller 117. In a manner similar to that in the embodiments explained above with reference to FIGS. 7 and 8, the controller 117 is configured, in the event of changes in the signal applied to the signal input 125, to change the potentials of the further multi-aperture plate 101 and of the single-aperture plates 153 in order to set the refractive powers of the lenses 121 with respect to the change in the curvature of the plane 29.

The controller 117 furthermore includes a signal input 127 via which a desired distance between the beam foci 31 in the plane 7 can be input to the controller 117.

Depending on the signal input via the signal input 127, the controller 117 changes the excitation of the condenser lens 25. With the change in the excitation of the condenser lens 25 there is a change in the divergence with which the particle beam 23 is incident on the multi-aperture plate 151. There is thus also a change in the divergence of the bundle of particle beams 5 in the beam path downstream of the multi-aperture plate 151. This in turn leads to a change in the regions within the cross sections of the openings in the further multi-aperture plate 101 in which the particle beams 5 pass through the openings. For example, the particle beams 5 do not pass through the openings centrally, but rather at a distance from the centres of the openings. As a result of the change in the excitation of the condenser lens 25, the distances from the centres of the openings in the further multi-aperture plate 101 at which the particle beams 5 pass through the openings are thus changed. If a particle beam does not pass through an opening of the further multi-aperture plate 101 centrally, then the lens effect of the lens 121 on the beam results not only in a focusing but also in a deflection, such that the particle beam 5 does not pass through the lens 121 rectilinearly, but rather is also deflected by the latter. The deflection of the beam 5 by the lens 121 results in a change in the location 31 in the plane 29 at which the beam is focused. Consequently, it is possible to change the distances between the beam foci 31 in the plane 29 by changing the excitation of the condenser lens 25. Since the plane 29 is imaged onto the plane 7, the distance between the beam foci in the image plane 7 also changes as a result.

The disclosure has been described above using preferred embodiments. Nevertheless, the disclosure, which is defined by the scope of the patent claims, is not restricted by the described embodiments and covers the scope given by the patent claims and equivalents thereof.

What is claimed is:

1. A particle beam system, comprising:
   a.) a multi-beam particle source configured to generate a first multiplicity of particle beams;
   b.) a first imaging optical unit having an optical axis, the first imaging unit configured to:
      i) particle-optically image a first object plane into an image plane; and
      ii) direct the first multiplicity of particle beams onto the image plane; and
   c.) a field generating arrangement configured to generate electric and/or magnetic deflection fields of adjustable strength,
   wherein:
      during operation of the particle beam system, the first multiplicity of particle beams are deflected by the deflection fields of the field generating arrangement by deflection angles dependent on the strength of the deflection fields;
      the field generating arrangement is configured so that, for one particle beam, two straight lines coincide with a trajectory of the particle beam before entering the field generating arrangement and after emerging from the field generating arrangement;
      the two straight lines are in a first plane;
      the two straight lines intersect at a vertex;
      the two straight lines define a deflection angle between each other;
      the vertex is in a second plane parallel to the object plane;
      the vertex is a first distance from the optical axis;
      a normal to the first plane through the vertex is a second distance from the optical axis;
      the second distance is less than 0.99 times the first distance;
      the second plane is a third distance from the object plane;
      the image plane is a fourth distance from the object plane; and
      the third distance is less than 0.1 times the fourth distance.

2. The particle beam system of claim 1, wherein the first imaging optical unit comprises an objective lens configured to provide a focusing magnetic field having a magnetic field strength that is greater than 20 mT at the image plane.

3. The particle beam system of claim 1, wherein:
   the multi-beam particle source comprises a first multiplicity of particle emitters alongside one another near the first object plane;
   each particle emitter is configured to generate at least one of particle beam of the first multiplicity of particle beams;
   the field generating arrangement comprises a magnetic coil configured to generate a magnetic field having a field direction in the first object plane that is orthogonal to the first object plane; and
   the particle emitters are in the magnetic field.

4. The particle beam system of claim 1, wherein, for each of at least 10% of the particle beams of the first multiplicity of particle beams, the field generating arrangement is configured so that:
   two straight lines coincide with a trajectory of the particle beam before entering the field generating arrangement and after emerging from the field generating arrangement;
   the two straight lines are in a first plane;
   the two straight lines intersect at a vertex;
   the two straight lines define a deflection angle between each other;
   the vertex is in a second plane parallel to the object plane;
   the vertex is a first distance from the optical axis;
   a normal to the first plane through the vertex is a second distance from the optical axis;
   the second distance is less than 0.99 times the first distance;
   the second plane is a third distance from the object plane;
   the image plane is a fourth distance from the object plane; and
   the third distance is less than 0.1 times the fourth distance; and
   the deflection angle by which the one particle beam is deflected by the field generating arrangement is greater than 10 µrad.

5. The particle beam system of claim 1, wherein:
   the field generating arrangement comprises a deflector array comprising a multiplicity of deflectors arranged alongside one another; and
   for each deflector, during operation of the particle beam system, a group of particle beams passes through each of the deflectors.

6. The particle beam system of claim 5, wherein:
   each deflector comprises a pair of electrodes opposite one another;
   for each deflector, during operation of the particle beam system, the group of particle beams passes through its pair of electrodes; and
   the particle beam system further comprises a controller configured to apply, for each deflector, mutually different adjustable electrical potentials to the electrodes of the pair of electrodes.

7. The particle beam system of claim 5, wherein:
   each of the deflectors comprises a first plate and a second plate are behind the first plate along the beam path;
   the first plate has a first opening;
   the second plate has a second opening;
   for each deflector, during operation of the particle beam system, the group of particle beams passes through the first and second openings;
   for each deflector, a center of the first opening, as viewed in a direction of the beam path, is laterally offset relative to a center of the second opening; and
   the particle beam system further comprises a controller configured to apply, for each deflector, mutually different electrical potentials to the first and second plates.

8. The particle beam system of claim 5, wherein the group of particle beams comprises a single particle beam.

9. The particle beam system of claim 1, wherein:
   the deflection fields are generated so that, for each of at least half of a multiplicity of pairs of the particle beams of the first multiplicity of particle beams, $0.9 < r1/r2 * \alpha2/\alpha1 < 1.1$;
   r1 represents a radial distance between a location at which a first particle beam of the pair passes through the first object plane and a center of the first object plane;

r2 represents a radial distance between a location at which a second particle beam of the pair passes through the first object plane and the center of the first object plane;

α1 represents the absolute value of the deflection angle by which the first particle beam is deflected; and α2 represents the absolute value of the deflection angle by which the second particle beam is deflected.

10. The particle beam system of claim 9, wherein, during operation of the particle beam system, the deflection fields are configured to deflect the particles substantially in a circumferential direction around the center of the first object plane.

11. The particle beam system of claim 1, wherein:
the multi-beam particle source comprises:
- a particle emitter configured to generate a particle beam; and
- a multi-aperture plate comprising a multiplicity of openings configured so that, during operation of the particle beam system, the particles of the particle beam pass through the openings to generate the first multiplicity of particle beams downstream of the multi-aperture plate.

12. A particle beam system, comprising:
a) an illumination system configured to direct the first multiplicity of particle beams alongside one another onto an object plane so that the first multiplicity of particle beams illuminate a multiplicity of incidence locations of the object plane;
b) an imaging optical unit having an optical axis, the imaging optical unit configured to:
    i) direct a second multiplicity of particle beams emanating from the incidence locations onto a detector array; and
    ii) image the object plane into an intermediate image plane in a beam path between the object plane and the detector array; and
c) a field generating arrangement configured to generate electric and/or magnetic deflection fields of adjustable strength,
wherein:
    during operation of the particle beam system, the particle beams are deflected by the deflection fields of the field generating arrangement by deflection angles dependent on the strength of the deflection fields;
    the field generating arrangement is configured so that, for one particle beam, two straight lines coincide with a trajectory of the particle beam before entering the field generating arrangement and after emerging from the field generating arrangement;
    the two straight lines are in a first plane;
    the two straight lines intersect at a vertex;
    the two straight lines define a deflection angle between each other;
    the vertex is in a second plane parallel to the intermediate image plane;
    the vertex is a first distance from the optical axis;
    a normal to the first plane through the vertex is a second distance from the optical axis;
    the second distance is less than 0.99 times the first distance;
    the second plane is a third distance from the intermediate image plane;
    the intermediate image plane is a fourth distance from the detector array; and
    the third distance is less than 0.1 times the fourth distance.

13. The particle beam system of claim 12, wherein the imaging optical unit comprises an objective lens configured to provide a focusing magnetic field having a magnetic field strength that is greater than 20 mT at the object plane.

14. The particle beam system of claim 12, wherein, for each of at least 10% of the particle beams of the first multiplicity of particle beams, the field generating arrangement is configured so that:
    two straight lines coincide with a trajectory of the particle beam before entering the field generating arrangement and after emerging from the field generating arrangement;
    the two straight lines are in a first plane;
    the two straight lines intersect at a vertex;
    the two straight lines define a deflection angle between each other;
    the vertex is in a second plane parallel to the object plane;
    the vertex is a first distance from the optical axis;
    a normal to the first plane through the vertex is a second distance from the optical axis;
    the second distance is less than 0.99 times the first distance;
    the second plane is a third distance from the object plane;
    the image plane is a fourth distance from the object plane; and
    the third distance is less than 0.1 times the fourth distance; and
    the deflection angle by which the one particle beam is deflected by the field generating arrangement is greater than 10 μrad.

15. The particle beam system of claim 12, wherein:
    the field generating arrangement comprises a deflector array comprising a multiplicity of deflectors arranged alongside one another; and
    for each deflector, during operation of the particle beam system, a group of particle beams passes through each of the deflectors.

16. The particle beam system of claim 15, wherein:
    each deflector comprises a pair of electrodes opposite one another;
    for each deflector, during operation of the particle beam system, the group of particle beams passes through its pair of electrodes; and
    the particle beam system further comprises a controller configured to apply, for each deflector, mutually different adjustable electrical potentials to the electrodes of the pair of electrodes.

17. The particle beam system of claim 15, wherein:
    each of the deflectors comprises a first plate and a second plate are behind the first plate along the beam path;
    the first plate has a first opening;
    the second plate has a second opening;
    for each deflector, during operation of the particle beam system, the group of particle beams passes through the first and second openings;
    for each deflector, a center of the first opening, as viewed in a direction of the beam path, is laterally offset relative to a center of the second opening; and
    the particle beam system further comprises a controller configured to apply, for each deflector, mutually different electrical potentials to the first and second plates.

18. The particle beam system of claim 15, wherein the group of particle beams comprises a single particle beam.

19. The particle beam system of claim 12, wherein:
the deflection fields are generated so that, for each of at least half of a multiplicity of pairs of the particle beams of the first multiplicity of particle beams, $0.9 < r1/r2*\alpha2/\alpha1 < 1.1$;
r1 represents a radial distance between a location at which a first particle beam of the pair passes through the first object plane and a center of the first object plane;
r2 represents a radial distance between a location at which a second particle beam of the pair passes through the first object plane and the center of the first object plane;
$\alpha1$ represents the absolute value of the deflection angle by which the first particle beam is deflected; and
$\alpha2$ represents the absolute value of the deflection angle by which the second particle beam is deflected.

20. The particle beam system of claim 19, wherein, during operation of the particle beam system, the deflection fields are configured to deflect the particles substantially in a circumferential direction around the center of the first object plane.

21. The particle beam system of claim 19, wherein:
the multi-beam particle source comprises:
a particle emitter configured to generate a particle beam; and
a multi-aperture plate comprising a multiplicity of openings configured so that, during operation of the particle beam system, the particles of the particle beam pass through the openings to generate the first multiplicity of particle beams downstream of the multi-aperture plate.

22. A particle beam system, comprising:
an illumination system configured to direct a multiplicity of particle beams onto a sample plane so that the particle beams illuminate a field of incidence locations at the sample plane,
wherein the illumination system comprises:
a multi-aperture plate in a beam path of the particle beams, the multi-aperture plate comprising a multiplicity of openings configured so that, for each opening in the multi-aperture plate, a particle beam passes through the opening;
a first single-aperture plate comprising an opening configured so that the multiplicity of particle beams passes through the opening of the first single-aperture plate;
a second single-aperture plate comprising an opening configured so that the multiplicity of particle beams passes through the opening of the second single-aperture plate; and
a voltage supply configured to apply to: i) to the first single-aperture plate an adjustable first electrical potential relative to the multi-aperture plate; and ii) to the second single-aperture plate an adjustable second electrical potential relative to the multi-aperture plate,
wherein:
the first single-aperture plate is a first distance from the multi-aperture plate;
the second single-aperture is a second distance from the multi-aperture plate; and
the first distance is less than half the second distance.

23. The particle beam system of claim 22, wherein, other the first and second single-aperture plates, no further single-aperture plate is disposed at a distance from the multi-aperture plate which is less than the second distance.

24. The particle beam system of claim 22, wherein the opening in the first plate has a first diameter, the opening in the second plate has a second diameter, and the second diameter is more than 1.5 times that first diameter.

25. The particle beam system of claim 22, wherein the first single-aperture plate is between the multi-aperture plate and the second single-aperture plate.

26. The particle beam system of claim 22, wherein the multi-aperture plate is between the first single-aperture plate and the second single-aperture plate.

27. The particle beam system of claim 22, further comprising a third single-aperture plate having an opening through which the multiplicity of particle beams passes during use of the particle beam system, wherein:
the third single-aperture plate is a third distance from the multi-aperture plate;
the third distance is greater than the second distance;
a distance between the second and third multi-aperture plates is less than the third distance.

28. The particle beam system of claim 22, further comprising a voltage supply configured to apply adjustable electrical potentials to the multi-aperture plate and the single-aperture plates.

29. The particle beam system of claim 28, wherein the illumination system is configured to focus the particle beams respectively in the beam path downstream of the multi-aperture plate and upstream of the object plane, and the corresponding beam foci are arranged on a curved surface.

30. The particle beam system of claim 29, further comprising a controller configured to control the voltage supply and to receive a first signal representing a desired curvature of the surface, wherein, when the first signal changes, the controller causes the voltage supply to change a potential difference between the multi-aperture plate and the first single-aperture plate to a greater extent than a potential difference between the multi-aperture plate and the second or third single-aperture plate.

31. The particle beam system of claim 29, further comprising a controller configured to control the voltage supply and to receive a second signal representing a desired distance between the incidence locations of the particle beams in the object plane, wherein, when the second signal changes, the controller causes the voltage supply to change a potential difference between the multi-aperture plate and the first single-aperture plate to a lesser extent than a potential difference between the multi-aperture plate and the second or third single-aperture plate.

32. A particle beam system, comprising:
an illumination system configured to direct a multiplicity of particle beams onto an object plane so that the particle beams illuminate a field of incidence locations at the object plane,
wherein the illumination system comprises:
a particle emitter configured to generate a particle beam;
a condenser lens through which the particle beam passes;
a first multi-aperture plate in a beam path of the particle beam downstream of the condenser lens, the first multi-aperture plate comprising a multiplicity of openings through which particles of the particle beam pass to generate a multiplicity of particle beams downstream of the first multi-aperture plate;
a second multi-aperture plate arranged in the beam path downstream of the first multi-aperture plate, the second multi-aperture plate comprising a multiplicity of openings configured so that, for each opening in the second multi-aperture plate, one of the particle beams of the multiplicity of particle beams passes through the opening; and a controller configured to:
excite the condenser lens so that the condenser lens provides an adjustable refractive power;
receive a first signal representing a desired distance between the incidence locations of the particle beams in the object plane; and
adjust the refractive power of the condenser lens when the first signal changes.

33. The particle beam system of claim 32, wherein:

the illumination system is configured to focus the particle beams respectively in the beam path downstream of the multi-aperture plate and upstream of the object plane;

the corresponding beam foci are arranged on a curved surface;

the particle beam system further comprises a single-aperture plate in the beam path upstream or downstream of the second multi-aperture plate;

the single-aperture plate has an opening through which the multiplicity of particle beams passes during use of the particle beam system; and the controller is configured to:
i) provide an adjustable electrical potential difference between the single-aperture plate and the multi-aperture plate;
ii) receive a second signal representing a desired curvature of the surface; and
iii) change the potential difference between the single-aperture plate and the multi-aperture plate in the event of a change in the second signal.

* * * * *